United States Patent [19]
Hosotani et al.

[11] Patent Number: 5,652,728
[45] Date of Patent: Jul. 29, 1997

[54] DYNAMIC MEMORY

[75] Inventors: Shiro Hosotani; Minobu Yazawa; Kazuya Yamanaka, all of Hyogo, Japan

[73] Assignee: Mitsubishi Denki Kabushiki Kaisha, Tokyo, Japan

[21] Appl. No.: 524,930

[22] Filed: Sep. 8, 1995

[30]  Foreign Application Priority Data

Sep. 19, 1994 [JP] Japan .................................. 6-223465
Apr. 27, 1995 [JP] Japan .................................. 7-104218

[51] Int. Cl.$^6$ ...................................................... G11C 7/00
[52] U.S. Cl. ........................................... 365/210; 365/149
[58] Field of Search .................................. 365/149, 210, 365/203

[56]  References Cited

U.S. PATENT DOCUMENTS

| | | | |
|---|---|---|---|
| 4,491,858 | 1/1985 | Kawamoto | 365/210 X |
| 4,803,664 | 2/1989 | Itoh | 365/210 |
| 4,935,896 | 6/1990 | Matsumura et al. | 365/149 |

FOREIGN PATENT DOCUMENTS

| | | |
|---|---|---|
| 60-136992 | 7/1985 | Japan . |
| 1-137491 | 5/1989 | Japan . |

OTHER PUBLICATIONS

"A 3V, 100Mhz, 35wW, Dynamic Line Memory Marco Cell for HDTV Applications" IEEE 1992 Custom Integrated Circuits Conference.

"An Experimental 2–bit/Cell Storage DRAM for Macrocell or Memory–on–Logic Application" IEEE Journal of Solid–State Circuits, vol. 24, No. 2, Apr. 1989.

*Primary Examiner*—Joseph A. Popek
*Attorney, Agent, or Firm*—Lowe, Price, LeBlanc & Becker

[57] ABSTRACT

Dummy information of a third level, which is between first and second levels written in a plurality of memory cells, is written in a dummy memory cell from a source node through transistors. Thus, a potential difference is caused between a read bit line and a dummy read bit line in reading. A potential comparison circuit indicates the level of information read from any memory cell on the basis of the comparison result as to the potentials of the dummy read bit line and the read bit line. Thus, the read rate is increased, the read operation is stabilized and increase of the chip area is suppressed.

26 Claims, 20 Drawing Sheets

DYNAMIC MEMORY

BACKGROUND OF THE INVENTION

1. Field of the Invention

The present invention relates to a dynamic memory, and more particularly, it relates to a 3-transistor 1-capacitor dynamic memory.

2. Description of the Background Art

Dynamic memories include a 3-transistor 1-capacitor memory, which is provided with memory cells each having three transistors and one capacitor. Such a dynamic memory having 3-transistor 1-capacitor memory cells may be employed as a FIFO (first-in first-out) memory.

FIG. 22 is a block diagram showing the structure of a conventional FIFO memory.

Referring to FIG. 22, this FIFO memory includes a memory cell array 1, a write row pointer 2, a read row pointer 3, an input circuit 4 and an output circuit 6. The memory cell array 1 includes a plurality of memory cells 10 which are arranged in a plurality of rows and a plurality of columns. Each memory cell 10 has three transistors and one capacitor.

Write word lines WWLi ($0 \leq i \leq 10$) and read word lines RWLi ($0 \leq i \leq 10$) are provided in correspondence to the respective rows of the memory cell array 1. On the other hand, write bit lines WBLj ($0 \leq j \leq 11$) and read bit lines RBLj ($0 \leq j \leq 11$) are provided in correspondence to the respective columns of the memory cell array 1.

The write row pointer 2 and the input circuit 4 select a memory cell for writing data therein. In order to select the memory cell, the write pointer 2 selects a write word line WWLi to be activated, while the input circuit 4 selects a write bit line WLBj for transmitting the data.

The read row pointer 3 and the output circuit 6 select a memory cell whose data must be read out. In order to select the memory cell, the read row pointer 3 selects a read word line RWLi to be activated, while the output circuit 6 selects a read bit line RBLj for transmitting the data.

In the FIFO memory having the aforementioned structure, written data are read in the written order.

The structure of the memory cell array 1 provided in the FIFO memory shown in FIG. 22 is now described in detail. FIG. 23 is a circuit diagram showing the structure of the memory cell array 1 provided in the FIFO memory of FIG. 22 in detail.

Referring to FIG. 23, the plurality of write word lines WWLi and the plurality of read word lines RWLi as well as the plurality of write bit lines WLBj and the plurality of read bit lines RBLj are arranged to intersect with each other.

Source nodes N1 receive source potentials Vdd. First ends of the plurality of read bit lines RBLj are connected to the source nodes N1 through precharge transistors 15 respectively. On the other hand, second ends of the read bit lines RBLj are connected to input terminals of inverters 60 respectively.

Memory cells 10 are arranged on the plurality of intersections between the word lines WWLi and RWLi and the bit lines WBLj and RBLj respectively. Each memory cell 10 includes three N-channel MOS transistors 11, 12 and 13 and one capacitor 14.

Each memory cell 10 has the following structure: A source electrode of the transistor 12 is connected to a ground node N2. The transistor 11 is connected between a gate electrode of the transistor 12 and the write bit line WLBj of the corresponding column. A gate electrode of the transistor 11 is connected to the write word line WWLi of the corresponding row. A node between the gate electrode of the transistor 12 and the transistor 11 is a storage node N3.

The transistor 13 is connected between a drain electrode of the transistor 12 and the read bit line RBLj of the corresponding column. A gate electrode of the transistor 13 is connected to the read word line RWLi of the corresponding row. The capacitor 14 is connected between the ground node N2 and the storage node N3.

Write and read operations of the FIFO memory are now described with reference to the memory cell array shown in FIG. 23.

In the write operation, the potential of the write word line WWLi of the row for writing data is converted to a level "1". In response to this, the transistor 11 provided in the memory cell 10 of this row is turned on. Thus, data of a level "1" or "0" transmitted to the write bit line WBLj is transmitted to the capacitor 14 through the transistor 11. In this case, the storage node N3 is at a level "1" or "0".

In advance of the read operation, on the other hand, the transistors 15 are first turned on in response to a control signal S. Thus, the read bit lines RBLj are precharged at levels "1", and thereafter the transistors 15 are turned off.

Then, the read word line RWLi of the row for reading data is converted to a level "1". The transistor 13 is turned on in response to this.

If the capacitor 14 currently stores data of a level "1", the transistor 12 is in an ON state. Therefore, the read bit line RBLj is connected to the ground node N2 through the transistors 13 and 12. Thus, the potential of the read bit line RBLj is reduced to a ground potential Vss. Consequently, the potential of the read bit line RBLj reaches a level "0".

If the capacitor 14 stores data of a level "0" in an ON state of the transistor 13, on the other hand, the transistor 12 is in an OFF state. Therefore, the read bit line RBLj is not connected with the ground node N2. Consequently, the potential of the read bit line RBLj is maintained at a level "1".

Thus, the level of the potential which is transmitted to each read bit line RBLj is inverted at each inverter 60 and outputted. Therefore, the logical level of a signal which is outputted from each inverter 60 is identical to that of data stored in each capacitor 14.

However, the conventional FIFO memory having the aforementioned structure is problematic in operation, due to first to fifth drawbacks described later.

FIG. 24 is a circuit diagram of each memory cell for illustrating problems in operation of the conventional FIFO memory. In FIG. 24, portions which are common to those in FIG. 23 are denoted by the same reference numerals, to omit redundant description.

Referring to FIG. 24, a coupling capacitance is present between the storage node N3 and each signal line. For example, a coupling capacitance 17 is present between the storage node N3 and the read bit line RBLj. Further, a parasitic capacitance 13 is present between the drain electrode and the gate electrode of the transistor 12. The FIFO memory includes drawbacks in operation, which result from presence of such capacitances.

The first to fifth drawbacks are now described in detail respectively. The first drawback resides in that a potential which is lower than the potential Vdd of the write bit line WBLj by a threshold voltage Vth of the transistor 11 is transmitted to the capacitor 14 when a level "1" is written in the capacitor 14, since the transistor 11 is of the N-channel MOS type. Consequently, the potential of the storage node N3 is Vdd–Vth, also when the potential of the write bit line WBLj is Vdd.

The second drawback resides in that a substrate effect acts in the transistor 11 since the source electrode is at a higher potential than a back gate electrode. Consequently, the potential which is transmitted from the write bit line WBLj to the capacitor 14 through the transistor 11 is further reduced in addition to the potential reduction caused by the first drawback. In more concrete terms, the potential of the storage node N3 is about 1.5 V when the source potential Vdd is 3 V, for example.

The third drawback resides in that the potential of the storage node N3 is increased or reduced by about 0.1 V, for example, by signal interference through the coupling capacitance, such as the coupling capacitance 17, between the storage node N3 and each signal line shown in FIG. 24.

The fourth drawback resides in that the potential of the storage node N3 is increased or reduced by about 0.1 V, for example, by signal interference through the parasitic capacitance 18 shown in FIG. 24.

The fifth drawback resides in that electric charges which are stored in the capacitor 14 leak to reduce the potential of the storage node N3 which is at the level "1".

In the conventional FIFO memory, the following problems result from the first to fifth drawbacks:

When data of a level "1" is stored in the memory cell 10, the storage potential (potential of the storage node N3) is reduced on the basis of the first to fifth drawbacks. Therefore, the value of a current flowing in the transistor 12 is reduced in reading. Consequently, the read rate is disadvantageously reduced.

When data of a level "0" is stored in the memory cell 10, on the other hand, the storage potential is increased on the basis of the third and fourth drawbacks. Thus, a small current flows in the transistor 12 in reading. Consequently, the read bit line RBLj cannot maintain "1", leading to a malfunction.

It may conceivably be possible to suppress these two problems by increasing the capacitance value of the capacitor 14 and the size (drivability) of the transistor 12. In this case, however, the chip area of the memory is disadvantageously increased. Therefore, this countermeasure is improper.

Further, such a FIFO memory is generally used as the so-called dedicated memory which is integrated on the same chip as a logic circuit. In this case, necessary word and bit numbers are varied with applications.

In order to provide a memory which is varied in capacitance value and transistor size as described above by the conventional structure shown in FIG. 23, therefore, it is necessary to change the capacitance value and the transistor size in response to the application. In this case, therefore, a large load is applied in relation to development of the memory.

SUMMARY OF THE INVENTION

An object of the present invention is to provide a dynamic memory which can increase the read rate while suppressing increase of its chip area.

Another object of the present invention is to provide a dynamic memory which can stabilize its read operation while suppressing increase of its chip area.

Still another object of the present invention is to provide a dynamic memory which can increase the read rate and stabilize its read operation while suppressing increase of its chip area.

A further object of the present invention is to provide a dynamic memory which can optimize power consumption in response to its specification.

The dynamic memory according to the present invention comprises a plurality of memory cells, at least one dummy memory cell, at least one write bit line, at least one dummy information supply circuit, at least one read bit line, a dummy read bit line and at least one comparison circuit.

The plurality of memory cells are arranged in at least one column, for storing information written therein. On the other hand, dummy information is written in at least one dummy memory cell.

At least one write bit line supplies information of a first or second level to be selectively written in the plurality of memory cells. At least one dummy information supply circuit fixedly supplies dummy information, which is at a third level between the first and second levels, to be written in the dummy memory cell.

A potential which is responsive to information selectively read from the plurality of memory cells is transmitted to at least one read bit line. On the other hand, a potential which is responsive to information read from the dummy memory cell is transmitted to the dummy read bit line.

Each of the plurality of memory cells and the dummy memory cell includes a capacitor and first to third transistors.

The capacitor is adapted to store information. The first transistor transmits information which is supplied from the corresponding write bit line or the dummy information supply circuit to the capacitor in writing. The second transistor supplies a potential which is responsive to the level of the information stored in the capacitor. The third transistor transmits the potential which is supplied from the second transistor to the corresponding read bit line or the dummy read bit line in reading.

At least one comparison circuit compares the potentials of the read bit line and the dummy read bit line with each other, and outputs a signal indicating the level of the information selectively read from the plurality of memory cells on the basis of the comparison result.

Thus, the information of the first or second level is written in the plurality of memory cells from the write bit line. The dummy information of the third level is fixedly written in the dummy memory cell from the dummy information supply circuit. Each of the plurality of memory cells and the dummy memory cell includes the three transistors and the capacitor, so that information is stored in the one capacitor.

The plurality of memory cells selectively transmit the potential which is responsive to the information of the first or second level to the read bit line. The dummy memory cell transmits the potential which is responsive to the dummy information of the third level to the dummy read bit line.

The third level which is written in the dummy memory cell is a level between the first and second levels written in the memory cells. Therefore, the level of the potential transmitted to the dummy read bit line is between two levels which can be transmitted to the read bit line.

The comparison circuit compares the potentials of the dummy read bit line and the read bit line with each other. The potential of the dummy read bit line which is compared with that of the read bit line by the comparison circuit is at an intermediate level of the amplitude of the potential at the read bit line. Therefore, the comparison circuit can output a signal indicating the level of the information read from the memory cells, by determining whether the potential at the read bit line is high or low with reference to the potential at the dummy read bit line.

Thus, it is possible to indicate the level of information which is read from any memory cell on the basis of the result of comparison between the potentials of the dummy read bit line and the read bit line, whereby the read rate can be increased while the read operation can be stabilized. Since the read rate is thus increased, further, it is not necessary to increase the chip area, whereby increase of the chip area can be suppressed.

The dynamic memory according to this aspect may further comprise at least one first potential fixing circuit, at least one control signal generation circuit, and at least one second potential fixing circuit.

At least one first potential fixing circuit fixes the potential of the dummy read bit line at a first potential when this potential is lower than a first prescribed potential, which is higher than the minimum potential of the read bit line.

At least one control signal generation circuit receives an output signal of the comparison circuit and a prescribed clock signal defining timing for fixing the potential of the read bit line, and generates the output signal of the comparison circuit as a control signal for fixing the potential of the read bit line in response to the clock signal.

At least one second potential fixing circuit fixes the potential of the read bit line at a second prescribed potential which is higher than the first prescribed potential in response to the control signal from the control signal generation circuit when this control signal indicates that the potential of the read bit line is higher than that of the dummy bit line.

According to this structure, the potential of the dummy read bit line is fixed to the first prescribed potential by the first potential fixing circuit when the former is reduced below the latter. Therefore, the potential of the dummy read bit line is fixed at a potential which is higher than the minimum potential of the read bit line.

The control signal generation circuit generates the control signal at the timing defined by the clock signal. This control signal is the output signal of the comparison circuit. When the potential of the read bit line is higher than that of the dummy read bit line in reading, the second potential fixing circuit fixes the potential of the read bit line at the second prescribed potential in response to the control signal. The second prescribed potential is higher than the first prescribed potential. Therefore, the potential of the dummy read bit line is fixed at a potential which is higher than the fixed potential of the read bit line.

Also when the dynamic memory operates at a low speed, therefore, a potential difference is caused between the read bit line and the dummy read bit line. Thus, it is possible to determine information read from any memory cell in the comparison circuit, also when the dynamic memory operates at a low speed. Consequently, the read operation can be stabilized.

The dynamic memory according to this aspect further comprises at least one first potential fixing circuit, at least one control signal generation circuit and at least one second potential fixing circuit.

At least one first potential fixing circuit fixes the potential of the dummy read bit line at a first prescribed potential, which is higher than the minimum potential of the read bit line, when the former is lower than the latter.

At least one control signal generation circuit compares the potential of the read bit line with that of the dummy read bit line, and outputs a control signal for fixing the potential of the read bit line in response to the comparison result.

This control signal generation circuit includes a diode circuit and a comparison/output circuit. The diode circuit supplies a potential which is lower than a first prescribed level. The comparison/output circuit compares a first potential which is the potential of the read bit line through the diode circuit with a second potential which is the potential of the dummy bit line, and outputs a control signal reaching a second prescribed level when the first potential is higher than the second potential.

At least one second potential fixing circuit fixes the potential of the read bit line at a second prescribed potential which is higher than the first prescribed potential when the control signal of the control signal generation circuit is at the second prescribed level.

According to this structure, the potential of the dummy read bit line is fixed at the first prescribed potential by the first potential fixing circuit when the former is reduced below the latter in reading. Therefore, the potential of the dummy read bit line is fixed at a potential which is higher than the minimum potential of the read bit line.

The control signal generation circuit generates a control signal reaching the second prescribed level when the potential of the read bit line which is reduced by the diode circuit by the first prescribed level is higher than that of the dummy bread bit line. When the potential of the read bit line is reduced in reading, therefore, the control signal reaches the second prescribed level in order to fix the potential.

In response to the control signal, the potential of the read bit line is fixed at the second prescribed potential by the second potential fixing circuit. The second prescribed potential is higher than the first prescribed potential. Therefore, the potential of the read bit line is automatically fixed at a potential which is higher than the fixed potential of the dummy read bit line in such a read state that the potential of the read bit line is higher than that of the dummy read bit line.

Also when the dynamic memory operates at a low speed, therefore, a potential difference is caused between the read bit line and the dummy read bit line. Therefore, it is possible to determine information read from any memory cell in the comparison circuit, also when the dynamic memory operates at a low speed. Consequently, the read operation can be stabilized.

A dynamic memory according to another aspect of the present invention comprises a plurality of memory cells, at least one dummy memory cell, at least one write bit line, at least one dummy information supply circuit, at least one read bit line, a dummy read bit line, a capacitance circuit and a comparison circuit.

The plurality of memory cells are arranged at least in one column, for storing information written therein. Dummy information is written in at least one dummy memory cell.

At least one write bit line supplies information of a first or second level to be selectively written in the plurality of memory cells. At least one dummy information supply circuit fixedly supplies dummy information to be written in the dummy memory cell.

A potential which is responsive to information selectively read from the plurality of memory cells is transmitted to at least one read bit line. A potential which is responsive to information read from the dummy memory cell is transmitted to the dummy read bit line. The capacitance circuit is connected to the dummy read bit line, for converting the potential of the dummy read bit line to a level between potentials of two levels which are responsive to the information of the first or second level transmitted to the read bit line.

Each of the plurality of memory cells and the dummy memory cell includes a capacitor and first to third transistors.

The capacitor is adapted to store information. The first transistor transmits information supplied from the corresponding write bit line or the dummy information supply circuit to the capacitor in writing. The second transistor supplies a potential which is responsive to the level of the information stored in the capacitor. The third transistor transmits the potential supplied from the second transistor to the corresponding read bit line or the dummy read bit line in reading.

At least one comparison circuit compares the potentials of the read bit line and the dummy read bit line with each other, and outputs a signal indicating the level of information selectively read from the plurality of memory cells on the basis of the comparison result.

Thus, the information of the first or second level is written in the plurality of memory cells through the write bit line. The dummy information is fixedly written in the dummy memory cell through the dummy information supply circuit. Each of the plurality of memory cells and the dummy memory cell includes the three transistors and the capacitor, so that information is stored in the capacitor.

The plurality of memory cells selectively transmit the potential which is responsive to the information of the first or second level to the read bit line. The dummy memory cell transmits the potential which is responsive to the dummy information to the dummy read bit line.

The capacitance circuit is connected to the dummy read bit line, for converting the potential of the dummy read bit line to a level between two levels which are written in the memory cells. Thus, the potential of the dummy read bit line is at a level between two levels which can be transmitted to the read bit line.

The comparison circuit compares the potentials of the dummy read bit line and the read bit line with each other. The potential of the dummy read bit line which is compared with that of the read bit line by the comparison circuit is at an intermediate level of the amplitude of the potential at the read bit line. Therefore, the comparison circuit can output a signal indicating the level of the information read from the memory cells by determining whether the potential of the read bit line is high or low with reference to the potential of the dummy read bit line.

Thus, it is possible to indicate the level of information which is read from any memory cell on the basis of the result of comparison between the potentials of the dummy read bit line and the read bit line, whereby the read rate can be increased while the read operation can be stabilized. Since the read rate is thus increased, it is not necessary to increase the chip area, whereby increase of the chip area can be suppressed.

A dynamic memory according to still another aspect of the present invention comprises a plurality of memory cells, a plurality of dummy memory cells, a plurality of write bit lines, a dummy information supply circuit, a plurality of read bit lines, a plurality of dummy read bit lines and a plurality of comparison circuits.

The plurality of memory cells are arranged in a plurality of columns, for storing information written therein. The plurality of dummy memory cells are provided in a plurality of columns in such a mode that at least one column corresponds to a prescribed plurality of columns of the plurality of memory cells of the plurality of columns, so that dummy information is written therein.

The plurality of write bit lines are provided in correspondence to the respective columns of the plurality of memory cells, so that each write bit line supplies information of a first or second level to be written in the memory cells of the corresponding column. The dummy information supply circuit fixedly supplies dummy information to be written in the respective ones of the plurality of dummy memory cells.

The plurality of read bit lines are provided in correspondence to the respective columns of the plurality of memory cells, so that a potential which is responsive to information read from a memory cell of the corresponding column is transmitted to each read bit line. The plurality of dummy read bit lines are provided in correspondence to the respective columns of the plurality of dummy memory cells, so that a potential which is responsive to information read from a dummy memory cell of the corresponding column is transmitted to each dummy read bit line.

Each of the plurality of memory cells and the plurality of dummy memory cells includes a capacitor and first to third transistors. The capacitor is adapted to store information. The first transistor transmits information which is supplied from the corresponding write bit line or the dummy information supply circuit to the capacitor in writing. The second transistor supplies a potential which is responsive to the level of the information stored in the capacitor. The third transistor transmits the potential which is supplied from the second transistor to the corresponding read bit line or the dummy read bit line in reading.

The plurality of comparison circuits are provided in correspondence to the respective columns of the plurality of memory cells, and each comparison circuit has first and second input nodes receiving the potentials of the corresponding read bit line and the dummy read bit line corresponding to the read bit line respectively, for comparing the potentials received by these input nodes with each other and outputting a signal indicating the level of information read from the memory cell of the corresponding column on the basis of the comparison result.

In order to bring the potential of one dummy read bit line into a level between two level potentials which are transmitted to one read bit line in response to the information of the first or second level in reading, the total sum of input capacitance values in the second input nodes of a plurality of comparison circuits related to one dummy read bit line is rendered larger than the input capacitance value of the first input node of one comparison circuit related to one read bit line.

Thus, the dummy memory cells are provided in a plurality of columns so that each column corresponds to a prescribed plurality of columns of memory cells. The write bit lines write information of the first or second level in the plurality of memory cells. The dummy information supply circuit fixedly writes dummy information in the plurality of dummy memory cells. Each of the plurality of memory cells and the plurality of dummy memory cells includes the three transistors and the capacitor, so that the capacitor stores information.

The plurality of memory cells selectively transmit potentials responsive to the information of the first or second level to the corresponding read bit lines. The plurality of dummy memory cells transmit potentials responsive to the dummy information to the corresponding dummy read bit lines.

The plurality of comparison circuits compare the potentials of the corresponding ones of the read bit lines and the dummy read bit lines with each other. The total sum of input capacitance values in the second input nodes of a plurality of comparison circuits related to one dummy read bit line is rendered larger than the input capacitance value of the first input node of one comparison circuit related to one read bit line.

Therefore, each dummy read bit line has a larger capacitance value than the corresponding read bit line, whereby the potential of the dummy read bit line compared by each comparison circuit is at an intermediate level of the amplitude of the potential of the read bit line. Thus, each comparison circuit can output a signal indicating the level of information read from each memory cell by determining whether the potential of the read bit line is high or low with reference to the potential of the dummy read bit line.

Thus, it is possible to indicate the level of information which is read from any memory cell on the basis of the result of comparison between the potentials of the dummy read bit line and the read bit line, whereby the read rate can be increased while the read operation can be stabilized. Since the read rate is thus increased, it is not necessary to increase the chip area, whereby increase of the chip area can be suppressed.

The dynamic memory according to this aspect may further comprise a plurality of first potential fixing circuits, a plurality of control signal generation circuits and a plurality of second potential fixing circuits.

The plurality of first potential fixing circuits are provided in correspondence to the respective ones of the plurality of dummy read bit lines, so that each first potential fixing circuit fixes the potential of the corresponding dummy read bit line at a first prescribed potential, which is higher than the minimum potential of one read bit line, when the former is lower than the latter.

The plurality of control signal generation circuits are provided in correspondence to the respective ones of the plurality of comparison circuits, so that each control signal generation circuit receives an output signal of the corresponding comparison circuit and a prescribed clock signal defining timing for fixing the potential of each read bit line, for generating the output signal of the corresponding comparison circuit as a control signal for fixing the potential of the corresponding read bit line in response to the clock signal.

The plurality of second potential fixing circuits are provided in correspondence to the respective ones of the plurality of control signal generation circuits, so that each second potential fixing circuit fixes the potential of the corresponding read bit line at a second prescribed potential which is higher than the first prescribed potential in response to the control signal of the corresponding control signal generation circuit when the control signal indicates that the potential of the corresponding read bit line is higher than that of the corresponding dummy read bit line.

According to this structure, the potential of each dummy read bit line is fixed at the first prescribed potential by the corresponding first potential fixing circuit when the same is reduced below the first prescribed potential in reading. Therefore, the potential of each dummy read bit line is fixed at a level which is higher than the minimum potential of the corresponding read bit line.

Each control signal generation circuit generates the control signal at the timing which is defined by the clock signal. This control signal is the output signal of the corresponding comparison circuit.

In response to the control signal, the potential of the corresponding read bit line is fixed at the second prescribed potential by the corresponding second potential fixing circuit. The second prescribed potential is higher than the first prescribed potential. Therefore, the potential of each read bit line is fixed at a level which is higher than the fixed potential of the dummy bit line at prescribed timing in such a read state that the potential of the read bit line is higher than that of the dummy read bit line.

Also when the dynamic memory operates at a low speed, therefore, a potential difference is caused between each read bit line and each dummy read bit line. Therefore, each comparison circuit can determine information read from each memory cell also when the dynamic memory cell operates at a low speed. Consequently, the read operation can be stabilized.

The dynamic memory according to this aspect further comprises a plurality of first potential fixing circuits, a plurality of control signal generation circuits and a plurality of second potential fixing circuits.

The plurality of first potential fixing circuits are provided in correspondence to the respective ones of the plurality of dummy read bit lines, so that each first potential fixing circuit fixes the potential of the corresponding dummy read bit line at a first prescribed potential, which is higher than the minimum potential of a corresponding read bit line, when the former is lower than the latter.

The plurality of control signal generation circuits are provided in correspondence to respective ones of a plurality of combinations of the read bit lines and the dummy read bit lines whose potentials are compared with each other, for comparing the potentials of the corresponding read bit lines with those of the corresponding dummy bit lines and generating control signals for fixing the potentials of the corresponding read bit lines in response to the results of comparison. Each of the plurality of control signal generation circuits includes a diode circuit and a comparison/output circuit. The diode circuit is connected to the corresponding read bit line, and supplies a potential which is lower than the potential of the read bit line by a first prescribed level.

The comparison/output circuit compares a first potential which is the potential of the corresponding read bit line through the diode circuit with a second potential which is the potential of the corresponding dummy read bit line, and outputs a potential which is brought into a second prescribed level as a control signal when the first potential is higher than the second potential.

The plurality of second potential fixing circuits are provided in correspondence to the respective ones of the plurality of read bit lines, so that each second potential fixing circuit fixes the potential of the corresponding read bit line at the second prescribed potential which is higher than the first prescribed potential when the control signal of the corresponding control signal generation circuit is at the second prescribed level.

According to this structure, the potential of each dummy read bit line is fixed at the first potential by the corresponding first potential fixing circuit when the same is reduced below the first prescribed potential in reading. Therefore, the potential of each dummy read bit line is fixed at a level which is higher than the minimum potential of the corresponding read bit line.

Each control signal generation circuit generates the control signal which reaches the second prescribed level when the potential of the corresponding bit line which is reduced by the diode circuit by the first prescribed level is higher than that of the corresponding dummy read bit line. When the potential of the corresponding read bit line is reduced in reading, therefore, the control signal reaches the second prescribed level for fixing the potential. The potential of each read bit line is fixed at the second prescribed potential by the corresponding second potential fixing circuit in response to the corresponding control signal.

The second prescribed potential is higher than the first prescribed potential. Therefore, the potential of each read bit line is automatically fixed at a level which is higher than the fixed potential of the corresponding dummy bit line in such a read state that the potential of the read bit line is higher than that of the corresponding dummy read bit line.

Also when the dynamic memory operates at a low speed, therefore, a potential difference is caused between each read bit line and each dummy read bit line. Therefore, each comparison circuit can determine information read from each memory cell also when the dynamic memory operates at a low speed. Consequently, the read operation can be stabilized.

A dynamic memory according to a further aspect of the present invention comprises a plurality of memory cells, at least one dummy memory cell, at least one write bit line, at least one dummy information supply circuit, at least one read bit line, a dummy read bit line, a source node, a first load resistance circuit, a second load resistance circuit and a comparison circuit.

The plurality of memory cells are arranged in at least one column, for storing information written therein. Dummy information is written in at least one dummy memory cell.

At least one write bit line supplies information of a first or second level to be selectively written in the plurality of memory cells. At least one dummy information supply circuit fixedly supplies dummy information to be written in the dummy memory cell.

A potential which is responsive to information selectively read from the plurality of memory cells is transmitted to at least one read bit line. A potential which is responsive to information read from the dummy memory cell is transmitted to the dummy read bit line.

Each of the plurality of memory cells and the dummy memory cell includes a capacitor and first to third transistors. The capacitor is adapted to store information. The first transistor transmits information which is supplied from the corresponding write bit line or the dummy information supply circuit to the capacitor in writing. The second transistor supplies a potential which is responsive to the level of the information stored in the capacitor. The third transistor transmits the potential which is supplied from the second transistor to the corresponding read bit line or the dummy read bit line in reading.

The source node receives a source potential. The first load resistance circuit is connected between the source node and the read bit line, and has a first resistance value. The second load resistance circuit is connected between the source node and the dummy read bit line, and has a second resistance value which is smaller than the first resistance value.

The comparison circuit compares the potentials of the read bit line and the dummy read bit line with each other, and outputs a signal indicating the level of information selectively read from the plurality of memory cells on the basis of the comparison result.

Thus, information of the first or second level is written in the plurality of memory cells through the write bit line. Dummy information is fixedly written in the dummy memory cell through the dummy information supply circuit. Each of the plurality of memory cells and the dummy memory cell includes the three transistors and the capacitor, so that information is stored in the capacitor.

A potential which is responsive to the information of the first or second level is selectively transmitted from the plurality of memory cells to the read bit line. A potential which is responsive to the dummy information is selectively transmitted from the dummy memory cell to the dummy read bit line.

The first load resistance circuit is connected between the source node and the read bit line. Therefore, the potential of the read bit line is finally fixed in reading due to action of the first load resistance circuit.

The second load resistance circuit is connected between the source node and the dummy read bit line. Therefore, the potential of the dummy read bit line is finally fixed in reading due to action of the second load resistance circuit.

The resistance value of the second load resistance circuit is smaller than that of the first load resistance circuit. In case of a read operation of reducing both of the potentials of the read bit line and the dummy bit line, therefore, the fixed potential of the read bit line is fixed at a level which is lower than the fixed potential of the dummy read bit line.

Also in an intermediate stage of reducing both potentials, the potential of the read bit line goes lower than that of the dummy read bit line due to the large-small relation between the resistance values. Therefore, the potential of the dummy read bit line is at an intermediate level between two levels which can be transmitted to the read bit line.

The comparison circuit compares the potentials of the dummy read bit line and the read bit line with each other. The potential of the dummy read bit line which is compared by the comparison circuit is at an intermediate level of the amplitude of the potential of the read bit line. Therefore, the comparison circuit can output a signal indicating the level of information read from the memory cells by determining whether the potential of the read bit line is high or low with reference to the potential of the dummy read bit line.

Thus, it is possible to indicate the level of information which is read from any memory cell on the basis of the result of comparison between the potentials of the dummy read bit line and the read bit line, whereby the read rate can be increased while the read operation can be stabilized. Since the read rate is thus increased, it is not necessary to increase the chip area, whereby increase of the chip area can be suppressed.

Further, the potentials of the read bit line and the dummy read bit line are finally fixed respectively, whereby a potential difference is caused between each read bit line and each dummy read bit line also when the dynamic memory operates at a low speed. Therefore, each comparison circuit can determine information read from each memory cell also when the dynamic memory operates at a low speed. Consequently, the read operation can be further stabilized.

A dynamic memory according to a further aspect of the present invention comprises a plurality of memory cells, at least one write bit line, at least one read bit line, at least one dummy read bit line and at least one comparison circuit.

The plurality of memory cells are arranged at least in one column, for storing information written therein. At least one write bit line supplies information of a first or second level to be written in the plurality of memory cells.

A potential which is responsive to information read from the plurality of memory cells is transmitted to at least one read bit line. The potential of at least one dummy read bit line is set at a level between two levels which are responsive to the information of the first or second level transmitted to the read bit line.

Each of the plurality of memory cells includes a capacitor and first to third transistors.

The capacitor is adapted to store information. The first transistor transmits which is information supplied from the corresponding write bit line to the capacitor in writing. The second transistor supplies a potential which is responsive to the level of the information stored in the capacitor. The third transistor transmits the potential which is supplied from the second transistor to the corresponding read bit line in reading.

At least one comparison circuit compares the potentials of the read bit line and the dummy bit line with each other, and outputs a signal indicating the level of the information read from the plurality of memory cells on the basis of the comparison result.

Thus, the information of the first or second level is written in the plurality of memory cells from the write bit line. Each of the plurality of memory cells includes three transistors and one capacitor, so that the information is stored in the capacitor.

The potential which is responsive to the information of the first or second level is transmitted from the plurality of memory cells to the read bit line. The potential of the dummy read bit line is set to be at a level between the potentials of two levels which can be transmitted to the read bit line.

The comparison circuit compares the potentials of the dummy read bit line and the read bit line with each other. The potential of the dummy read bit line which is compared by the comparison circuit is at the intermediate level of the amplitude of the potential of the read bit line. Therefore, the comparison circuit can output a signal indicating the level of the information read from the memory cell by determining whether the potential of the read bit line is high or low with reference to the potential of the dummy read bit line.

Thus, it is possible to indicate the level of the information read from the memory cells on the basis of comparison between the potentials of the dummy read bit line and the read bit line, whereby the read rate is increased and the read operation can be stabilized. Due to such increase of the read rate, further, it is not necessary to increase the chip area for implementing increase of the read rate, whereby increase of the chip area can be suppressed.

The dynamic memory according to this aspect further comprises an input member and a first voltage generation circuit.

The input member receives a voltage signal from the exterior. The first voltage generation circuit generates a first voltage for controlling the comparison circuit in response to the voltage signal from the exterior.

The comparison circuit decides current consumption by of the comparison circuit in response to the magnitude of the first voltage received from the first voltage generation circuit.

Thus, the first voltage generation circuit generates the first voltage for controlling the comparison circuit in response to the voltage signal from the exterior which is transmitted from the input member. The comparison circuit decides its current consumption in response to the magnitude of the first voltage from the first voltage generation circuit.

Thus, the current consumption of the comparison circuit can be controlled by the external voltage signal, whereby the speed of the comparison circuit can be optimized in response to the specification of the dynamic memory, thereby optimizing power consumption.

A dynamic memory according to a further aspect of the present invention comprises a reference potential generation circuit, a potential deriving circuit, a plurality of memory cells, a plurality of dummy memory cells, at least one read bit line, a plurality of dummy read bit lines, a comparison circuit and a conversion circuit.

The reference potential generation circuit generates a plurality of first reference potentials of at least four levels, and a plurality of second reference potentials which are at intermediate levels of approximate levels in the first reference potentials. The potential deriving circuit selectively derives the plurality of first reference potentials which are generated from the reference potential generation circuit.

The plurality of memory cells are arranged at least in one column, for storing information of the first reference potentials derived by the potential deriving circuit written therein. The plurality of dummy memory cells are provided at least in the same number as the second reference potentials, so that information of each of the plurality of second reference potentials is written in each dummy memory cell.

A potential which is responsive to information selectively read from the plurality of memory cells is transmitted to at least one read bit line. The plurality of dummy read bit lines are provided in correspondence to the respective ones of the plurality of dummy memory cells, so that a potential which is responsive to information read from the corresponding dummy memory cell is transmitted to each dummy read bit line.

Each of the plurality of memory cells and the plurality of dummy memory cells includes a capacitor and first to third transistors. The capacitor is adapted to store information. The first transistor transmits information which is supplied from the corresponding write bit line or the dummy information supply circuit to the capacitor in writing. The second transistor supplies a potential which is responsive to the level of the information stored in the capacitor. The third transistor transmits the potential which is supplied from the second transistor to the corresponding read bit line or the dummy read bit line in reading.

The comparison circuit compares the potentials of the read bit line and the respective ones of the plurality of dummy read bit lines with each other. The conversion circuit converts the results of the comparison of the comparison circuit to information indicating the level of information selectively read from the plurality of memory cells, and outputs a signal thereof.

Thus, the information of the first reference potentials generated by the reference potential generation circuit and derived by the potential deriving circuit is written in the plurality of memory cells. Therefore, quaternary (2-bit) information is written in each memory cell. Information of the plurality of second reference potentials generated by the reference potential generation circuit is written in the plurality of dummy memory cells.

Potentials which are responsive to the first reference potentials are selectively transmitted from the plurality of memory cells to the read bit line. Information which is responsive to the second reference potentials is transmitted from the plurality of dummy memory cells to the plurality of dummy read bit lines respectively.

The comparison circuit compares the potentials of the read bit line and the respective ones of the plurality of dummy read bit lines with each other. The second reference potentials compared by the comparison circuit are at the intermediate levels of the approximate levels in the plurality of first reference potentials. Therefore, the results of comparison of the comparison circuit indicate code information determining a high or low potential of the read bit line with reference to the respective potentials of the plurality of dummy bit lines.

The conversion circuit converts the code information resulting from the comparison of the comparison circuit to a signal indicating the level of information read from each memory cell. Thus, the signal outputted from the conversion circuit can indicate quaternary (2-bit) information written in each memory cell.

Thus, it is possible to indicate the level of quaternary information read from each memory cell on the basis of the result of comparison between potentials of the plurality of dummy read bit lines and the read bit line, whereby the read rate can be increased and the read operation can be stabilized. Further, the level of quaternary information is written in each memory cell as described above, whereby the number of the memory cells can be remarkably reduced for reducing the chip area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in detail with reference to the drawings.

First Embodiment

Figure 1:
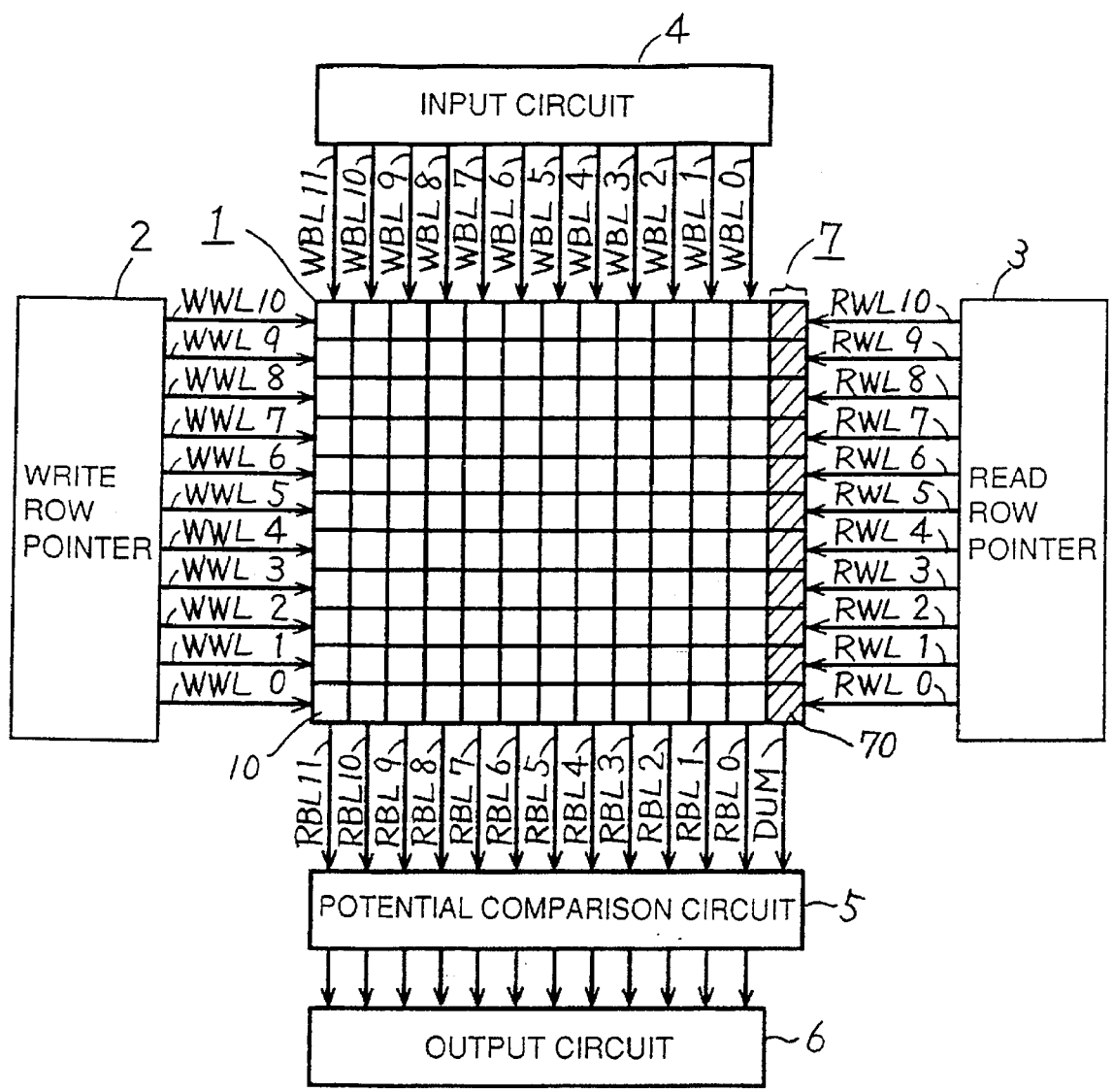
FIG. 1 is a block diagram schematically showing the structure of a FIFO memory according to a first embodiment of the present invention.

FIG. 1 is a block diagram showing the structure of a FIFO memory according to a first embodiment of the present invention. Referring to FIG. 1, parts which are common with those in FIG. 22 are denoted by the same reference numerals, to omit redundant description.

Figure 22:
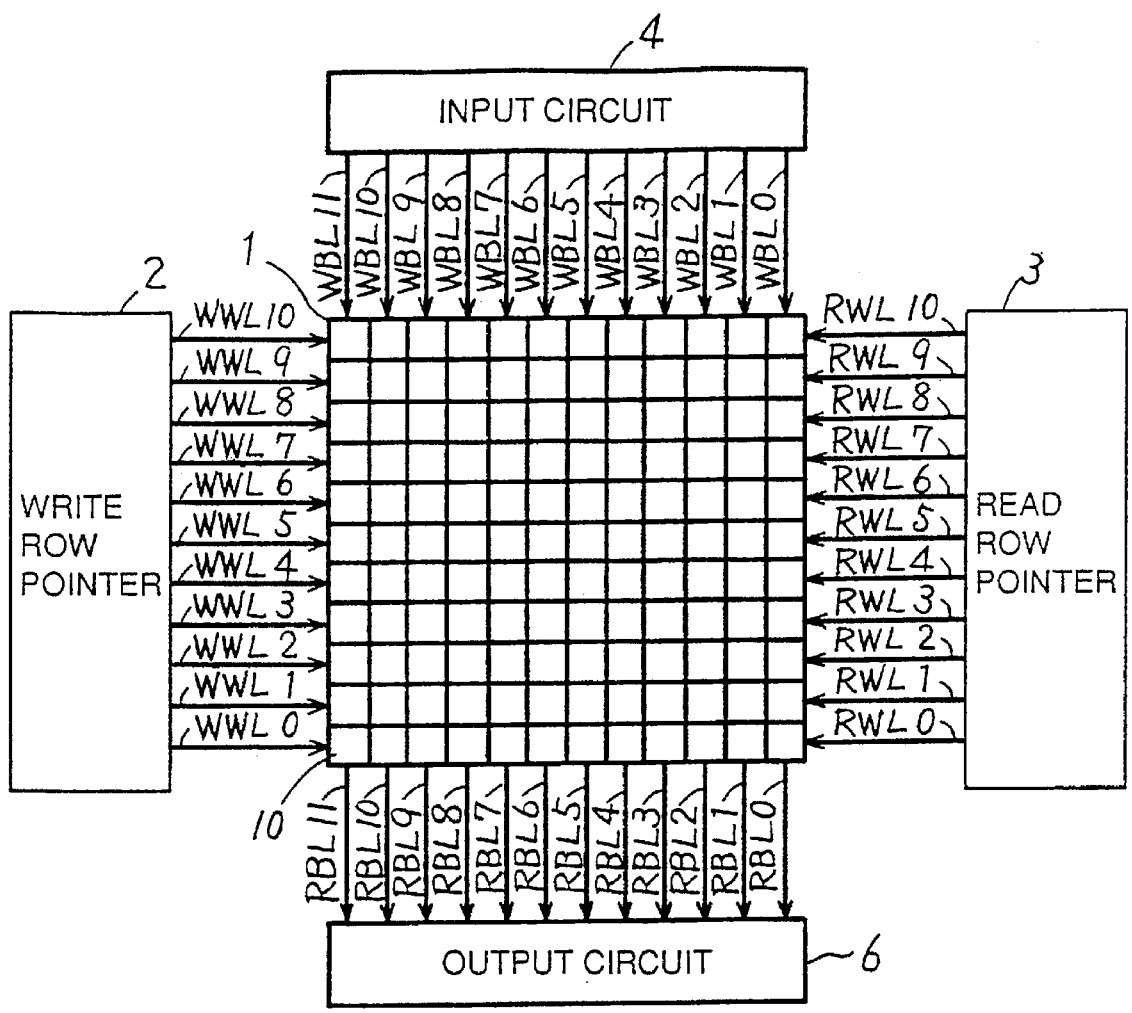
FIG. 22 is a block diagram showing the structure of a conventional FIFO memory.

The FIFO memory shown in FIG. 1 is different from that of FIG. 22 in a point that the FIFO memory is provided with a potential comparison circuit 5, a dummy memory cell column 7 and a dummy read bit line DUM.

The dummy memory cell column 7 includes a plurality of dummy memory cells 70 which correspond to respective rows of a memory cell array 1. The dummy memory cells 70 transmit potentials which are responsive to levels of data stored therein to a dummy read bit line DUM. These dummy memory cells 70 are selected by read word lines RWLi (0 ≤i≤10) of the corresponding rows respectively.

The potential comparison circuit 5 includes a plurality of differential amplifiers, as described later. This potential comparison circuit 5 compares respective potentials of read bit lines RBLj (0≤j≤11) with that of the dummy read bit line DUM, and supplies signals indicating the results of the comparison to an output circuit 6. The output circuit 6 is similar to that shown in FIG. 22.

In this FIFO memory, memory cells 10 of the memory cell array 1 and the dummy memory cells 70 of the same rows as these memory cells 10 are simultaneously selected in reading.

Figure 2:
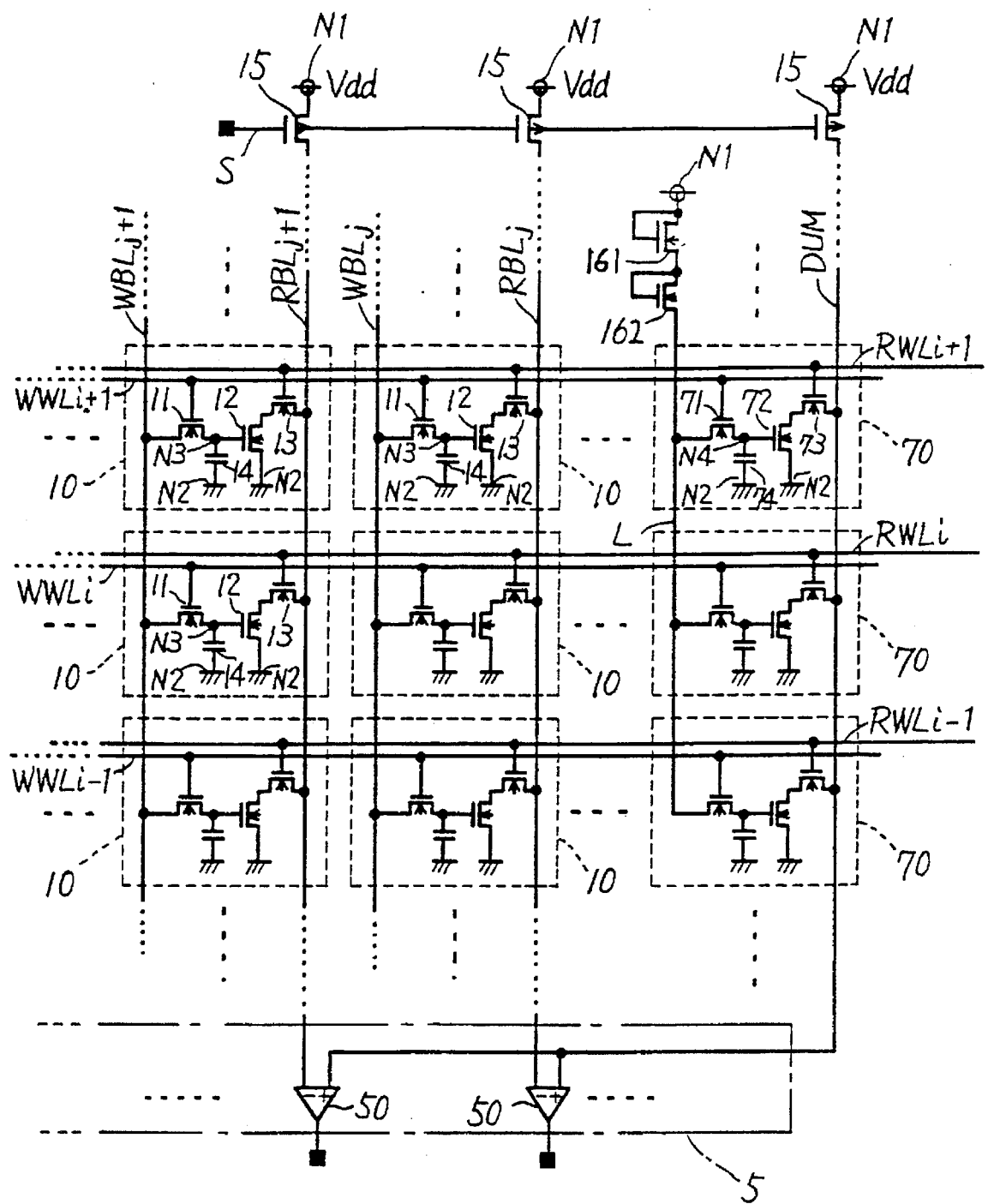
FIG. 2 is a circuit diagram showing the structures of a memory cell array, a dummy memory cell column and a potential comparison circuit provided in the FIFO memory of FIG. 1 in detail.
Figure 23:
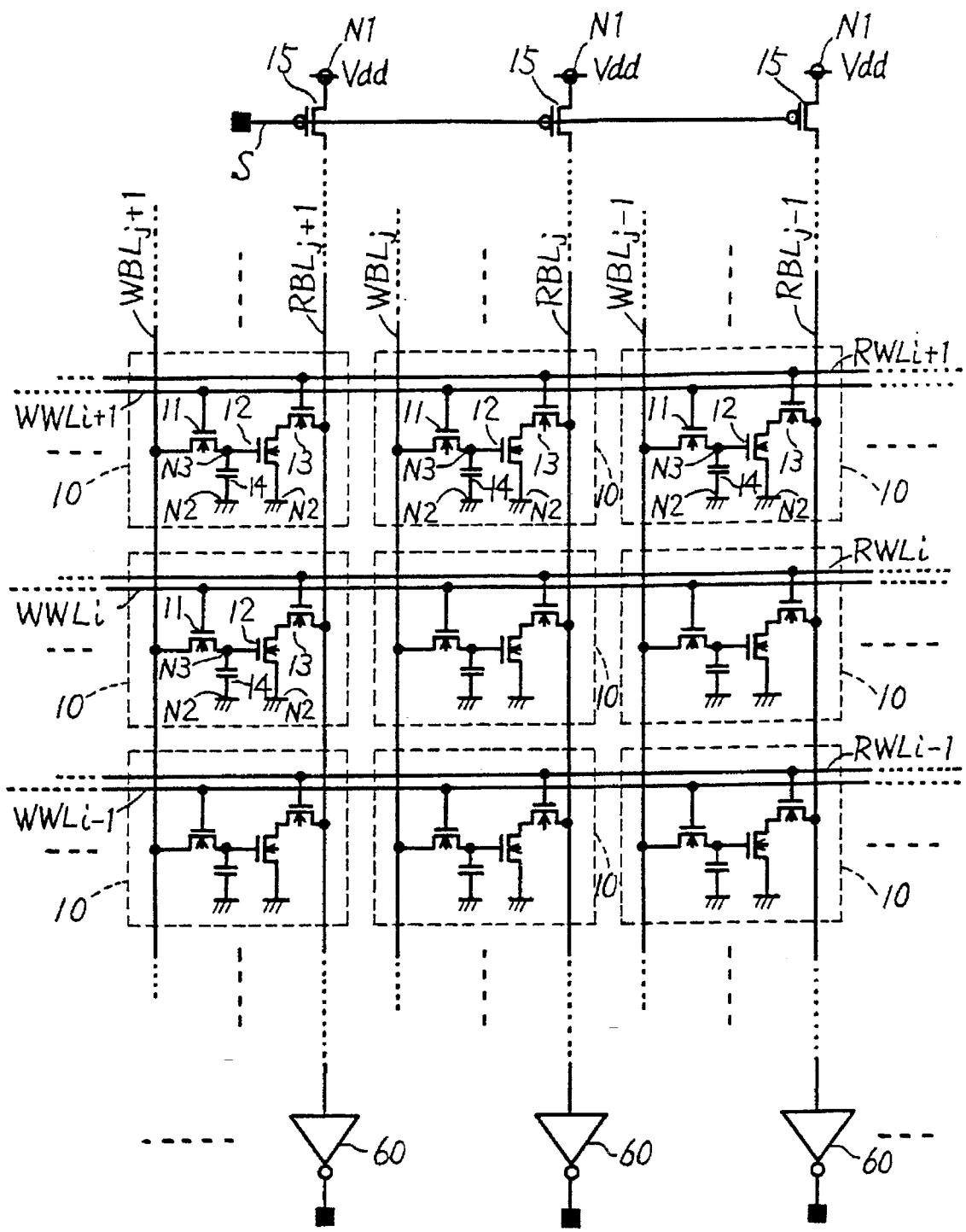
FIG. 23 is a circuit diagram showing the structure of a memory cell array provided in the FIFO memory of FIG. 22 in detail.
Figure 24:
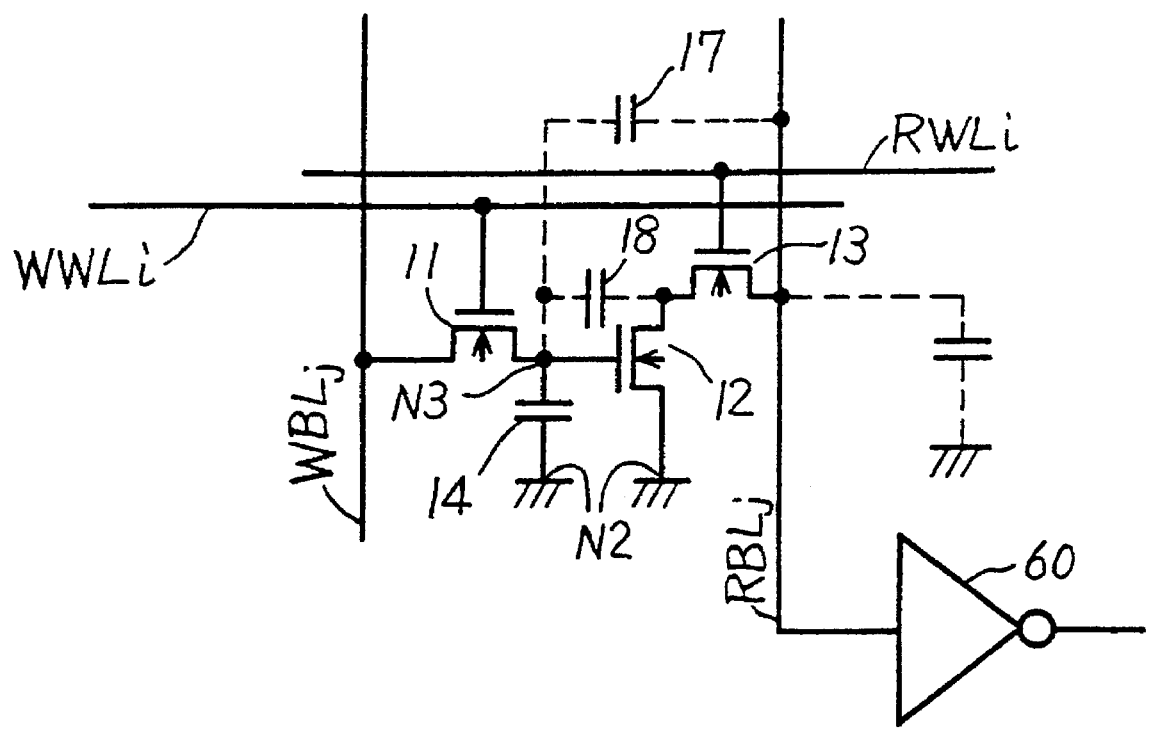
FIG. 24 is a circuit diagram of a memory cell for illustrating problems in operation of the conventional FIFO memory.

The structures of the memory cell array 1, the dummy memory cell column 7 and the potential comparison circuit 5 of the FIFO memory shown in FIG. 1 are now described in detail. FIG. 2 is a circuit diagram showing the structures of the memory cell array 1, the dummy memory cell column 7 and the potential comparison circuit 5 of the FIFO memory shown in FIG. 1 in detail. Referring to FIG. 2, parts which are common with those in FIG. 23 are denoted by the same reference numerals, to omit redundant description.

Referring to FIG. 2, the structures shown in FIG. 2 are different from those of FIG. 23 in the following four points: One dummy memory cell 70 is provided on each row. The dummy read bit line DUM is so provided that the potentials which are responsive to the levels of stored data are transmitted from the dummy memory cells 70 thereto. Two N-channel MOS transistors 161 and 162 are provided in series with each other for supplying a fixed potential to the dummy memory cells 70. The potential comparison circuit 5 is provided with a plurality of differential amplifiers 50.

The transistors 161 and 162, which are dummy information supply means, are diode-connected to a source node N1. The serially connected transistors 161 and 162 fixedly supply a potential, which is dummy information, to the respective ones of the dummy memory cells 70. This potential is at a level (Vdd−2·Vth) which is obtained by subtracting the total value 2·Vth of respective threshold voltages Vth of the two transistors 161 and 162 from a source potential Vdd.

The potential comparison circuit 5 is provided with the differential amplifiers 50 corresponding to the read bit lines RBLj respectively.

A first end of the dummy read bit line DUM is connected to a source node N1 through a transistor 15, similarly to those of the read bit lines RBLj. A second end of the dummy read bit line DUM is connected to non-inversion input terminals of all differential amplifiers 50 provided in the potential comparison circuit 5 respectively. Second ends of the read bit lines RBLj are connected to inversion input terminals of the corresponding differential amplifiers 50 respectively. Respective output signals of the differential amplifiers 50 are supplied to the output circuit 6 shown in FIG. 1.

Each of the dummy memory cells 70 includes three N-channel MOS transistors 71, 72 and 73, and one capacitor 74. Namely, each dummy memory cell 70 forms a 3-transistor 1-capacitance memory cell.

Noting each dummy memory cell 70, a source electrode of the transistor 72 is connected to a ground node N2. The transistor 71 is connected between a gate electrode of the transistor 72 and a potential supply line L from the transistor 162. A storage node N4 is provided between the gate electrode of the transistor 72 and the transistor 71.

The transistor 73 is connected between a drain electrode of the transistor 72 and the dummy read bit line DUM. The capacitor 74 is connected between the ground node N2 and the storage node N4. A gate electrode of the transistor 71 is connected to a write word line WWLi of the corresponding row. A gate electrode of the transistor 73 is connected to the read word line RWLi of the corresponding row.

Namely, each dummy memory cell 70 has a structure which is similar to that of each memory cell 10.

Operations of the FIFO memory shown in FIGS. 1 and 2 are now described.

First, a write operation is described. The write operation of each memory cell 10 is identical to that of the prior art shown in FIG. 23. The write operation of each dummy memory cell 70 is as follows:

The transistor 71 is turned on in response to activation of the write word line WWLi of the corresponding row. Thus, the potential whose level is reduced through the transistors 161 and 162 is supplied from the source node N1 to the capacitor 74.

Thus, the potential of the storage node N4 of the dummy memory cell 70 reaches an intermediate level between a "1" level potential (Vdd−Vth) which can be stored in a storage node N3 of each memory cell 10 and a "0" level potential VSS.

Figure 3:
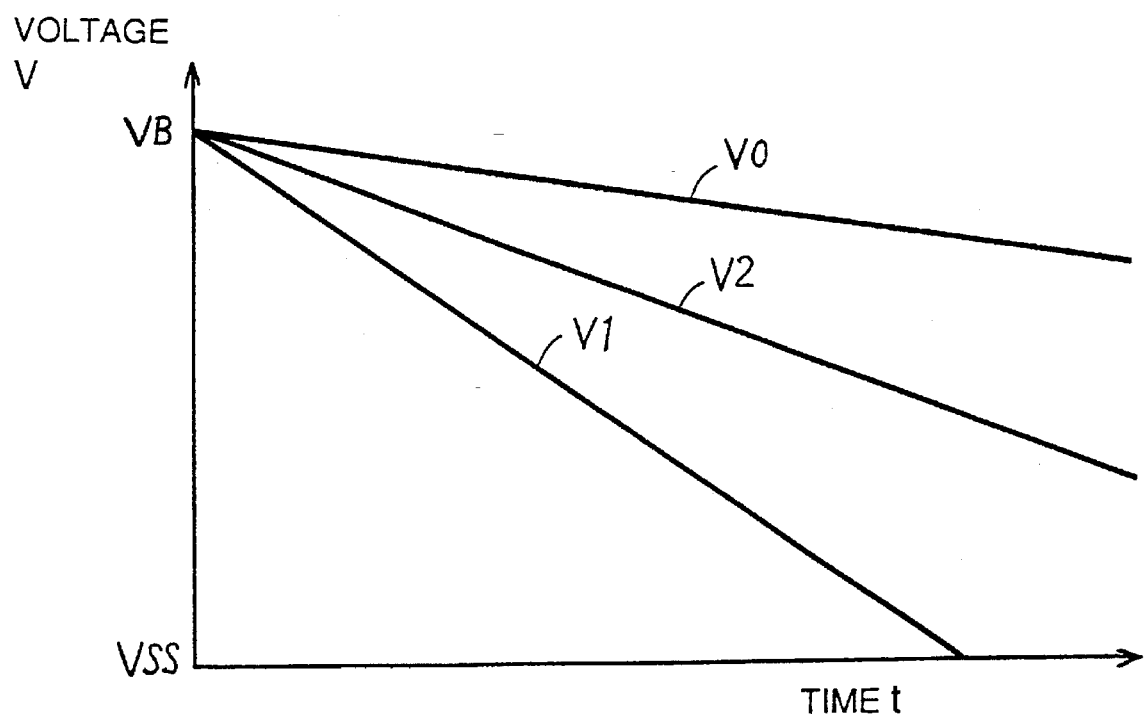
FIG. 3 is a graph showing the relation between potentials of a read bit line and a dummy bit line in a read operation of the FIFO memory according to the first embodiment of the present invention.

The read operation is now described. FIG. 3 is a graph showing the relation between the potentials of each read bit line RBLj and the dummy read bit line DUM in the read operation of the FIFO memory according to the first embodiment. Referring to FIG. 3, the axis of ordinates shows the potential V and the axis of abscissas shows the time t, for indicating potential states following a lapse of the time.

FIG. 3 shows potentials V0 and V1 of each read bit line RBLj in case of reading "0" and "1" level data stored in each memory cell 10 respectively, and a potential V2 of the dummy read bit line DUM reading "1" level data from each dummy memory cell 70.

Referring to FIG. 3, both of the read bit line RBLj and the dummy read bit line DUM are precharged at a precharge potential VB in an initial state. Then, the read word line RWLi is activated for reading.

When "0" level storage data is read from the memory cell 10, the potential of the read bit line RBLj is basically not reduced. However, the potential V0 of the read bit line RBLj is gradually reduced by signal interference between the storage node N3 and each signal line etc.

When the "1" level storage data is read from each memory cell 10, a transistor 12 is turned on and hence the potential V1 of the read bit line RBLj is quickly reduced toward the ground potential VSS, at a rate which is remarkably higher than that in the case of reading the "0" level data.

When "1" level storage data is read from each dummy memory cell 70, the transistor 72 is turned on and the potential V2 of the dummy read bit line DUM is reduced toward the ground potential VSS.

However, the rate of this reduction is lower than the reduction rate of the potential V1 of the read bit line RBLj in the case of reading the "1" level data. This is because the potential of the storage node N4 of the dummy memory cell 70 is lower than that of the storage node N3 of the memory cell 10 when the memory cell 10 and the dummy memory cell 70 store "1" data.

Thus, the potential of the storage node N4 is lower than that of the storage node N3, whereby a current flowing in the transistor 72 is smaller than that of a current flowing in the transistor 12 in reading. In this case, therefore, the potential V2 of the dummy read bit line DUM is reduced more slowly than the potential V1 of the read bit line RBLj.

Further, the reduction rate of the potential V2 of the dummy read bit line DUM is obviously higher than that of the potential V0 in the case of reading the "0" storage data from the memory cell 10. Therefore, the potential V2 of the dummy read bit line DUM is regularly at a level between the potentials V0 and V1 which can be taken by the read bit line RBLj.

Referring to FIG. 2, each differential amplifier 50 compares the potential of each read bit line RBLj with that of the dummy read bit line DUM. The differential amplifier 50 outputs a signal of a "1" level when the potential of the read bit line RBLj is lower than that of the dummy read bit line DUM.

When the potential of the read bit line RBLj is higher than that of the dummy read bit line DUM, on the other hand, the differential amplifier 50 outputs a signal of a "0" level. Namely, it is determined whether the potential of each read bit line RBLj is high or low with respect to the potential of the dummy read bit line DUM as a reference potential.

Therefore, each differential amplifier 50 outputs a signal of the same logical level as that of the data stored in the memory cell 10 from which data is read on the corresponding read bit line RBLj. Therefore, the potential comparison circuit 5 can determine the level of the data stored in the memory cell 10 whose data is read onto each read bit line RBLj and output the data.

In the FIFO memory according to the first embodiment, as hereinabove described, a potential which is lower than that supplied from each write bit line WBLj to each memory cell 10 for writing is supplied to each dummy memory cell 70 for writing, so that a potential difference is caused between the read bit line RBLj and the dummy read bit line DUM in reading. The two potentials causing this difference are compared with each other, for determining the level of data read from the memory cell 10 on the basis of the comparison result.

When a potential difference is caused between the read bit line RBLj and the dummy read bit line DUM, therefore, the storage data of the memory cell 10 can be determined at arbitrary timing. Namely, the FIFO memory can read data at arbitrary timing, whereby the read rate can be increased.

Further, data is read on the basis of the result of determination on the potential difference between each read bit line RBLj and the dummy bit line DUM, whereby a correct read operation can be performed regardless of fluctuation of the potential at the storage node N3 of the memory cell 10. Thus, the read operation can be stabilized in this FIFO memory.

In addition, the read rate can be increased without changing the sizes of the elements forming each memory cell 10, whereby the elements such as transistors forming the memory cell 10 can be reduced in size. Thus, the chip area of the memory can be reduced.

Description is now made on the reason why the rates of reduction of the potentials of the read bit line RBLj and the dummy read bit line DUM can be adjusted.

The read operation is equivalent to an operation of discharging charges Q which are stored in a capacitance C of the read bit line RBLj (or the dummy read bit line DUM) through the transistor 12 (or 72). Therefore, a transient response of the potential V of the read bit line RBLj (or the dummy read bit line DUM) in the read operation is expressed in the following equation (1):

$$v(t) = vB - 1/c \cdot t \quad (1)$$

This equation (1) is obtained by time-differentiating a formula Q=CV. In the equation (1), VB represents the initial value (precharge potential) of the potential of the read bit line RBLj (or the dummy read bit line DUM), and I represents a drain current of the transistor 12 (or 72).

This equation (1) indicates that the degree of reduction of the potential V is increased as the drain current I is increased and the capacitance C is reduced.

The FIFO memory according to the first embodiment is adapted to adjust the reduction rate of the potential V by adjusting the drain current I, on the basis of the assumption that the respective capacitances C of the read bit line RBLj and the dummy bit line DUM are at the same value.

The value of the drain current I flowing in the transistor 12 (or 72) is called the value of the drivability of the transistor 12 (or 72). In general, drivability of a transistor is controlled by varying the ratio of its channel width to its channel length.

A second embodiment can attain an effect similar to that of the first embodiment by adjusting the value of the capacitance C.

While the transistors 161 and 162 are provided in the first embodiment as means for supplying dummy data to the dummy memory cells 70, the means are not restricted to the transistors 161 and 162 but may be formed by other circuits, so far as the same supply a potential which is lower than that of each write bit line WBLj in case of writing "1" level data.

Second Embodiment

The second embodiment of the present invention is now described. According to the second embodiment, an effect which is similar to that of the first embodiment can be attained by increasing the capacitance value of a dummy read bit line DUM.

Figure 4:
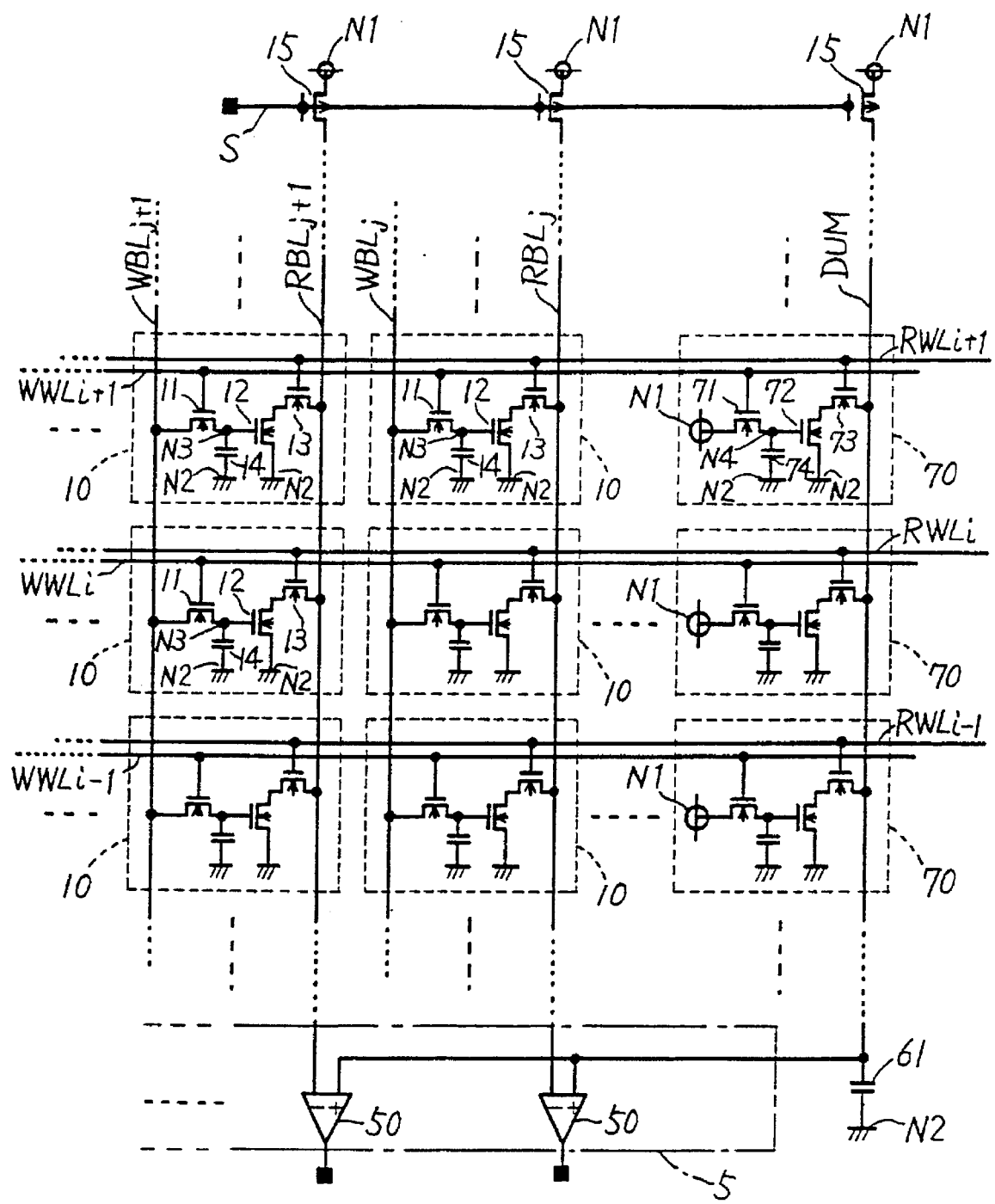
FIG. 4 is a circuit diagram showing the structures of a memory cell array, a dummy memory cell column and a potential comparison circuit provided in a FIFO memory according to a second embodiment of the present invention in detail.

FIG. 4 is a circuit diagram showing the structures of a memory cell array, a dummy memory cell column and a potential comparison circuit provided in a FIFO memory according to the second embodiment of the present invention in detail. Parts which are common with those of FIG. 2 are denoted by the same reference numerals, to omit redundant description.

Referring to FIG. 4, the FIFO memory according to the second embodiment is different from that shown in FIG. 2 in a point that no transistors 161 and 162 shown in FIG. 2 are provided but a capacitor 61 is provided. Therefore, a source potential Vdd is directly supplied to each dummy memory cell 70 from a source node N1.

The capacitor 61 is connected between the dummy read bit line DUM and a ground node N2. In this case, drivability of a transistor 12 of each memory cell 10 and that of a transistor 72 of each dummy memory cell 70 are set at the same value.

The operations are now described. In a write operation, the potential of a storage node N3 of each memory cell 10 is equalized with that of a storage node N4 of each dummy memory cell 70. In a read operation, on the other hand, both of each read bit line RBLj and the dummy read bit line DUM are precharged.

In this case, the amount of charges stored in the dummy read bit line DUM exceeds that of charges stored in the read bit line RBLj. This is because the capacitance of the dummy read bit line DUM is increased due to the connection with the capacitor 61.

When "1" level storage data is read from the memory cell 10, for example, a drain current of the transistor 12 of the memory cell 10 is equalized with that of the transistor 72 of the dummy memory cell 70.

However, the dummy read bit line DUM stores a larger amount of charges than the read bit line RBLj. When each read word line RWLi is thereafter activated for reading, therefore, characteristics similar to those shown in FIG. 3 are attained.

Referring to the above equation (1), the dummy read bit line DUM has a larger capacitance value C than the read bit line RBLj. Therefore, the reduction rate of the potential of the dummy read bit line DUM is lower than that of the potential of the read bit line RBLj. Therefore, the capacitor 61 is set at a capacitance value attaining the characteristics of FIG. 3 in this case.

In the FIFO memory according to the second embodiment, as hereinabove described, the characteristics of the read bit line RBLj and the dummy read bit line DUM in reading are similar to those in the first embodiment, whereby an effect similar to that of the first embodiment can be attained. Namely, it is possible to implement increase of the read rate, stabilization of the read operation and reduction of the chip area by connecting the capacitor 61 to the dummy read bit line DUM.

Third Embodiment

A third embodiment of the present invention is now described. In the third embodiment, the capacitance value of a dummy read bit line is increased, similarly to the second embodiment.

Figure 5:
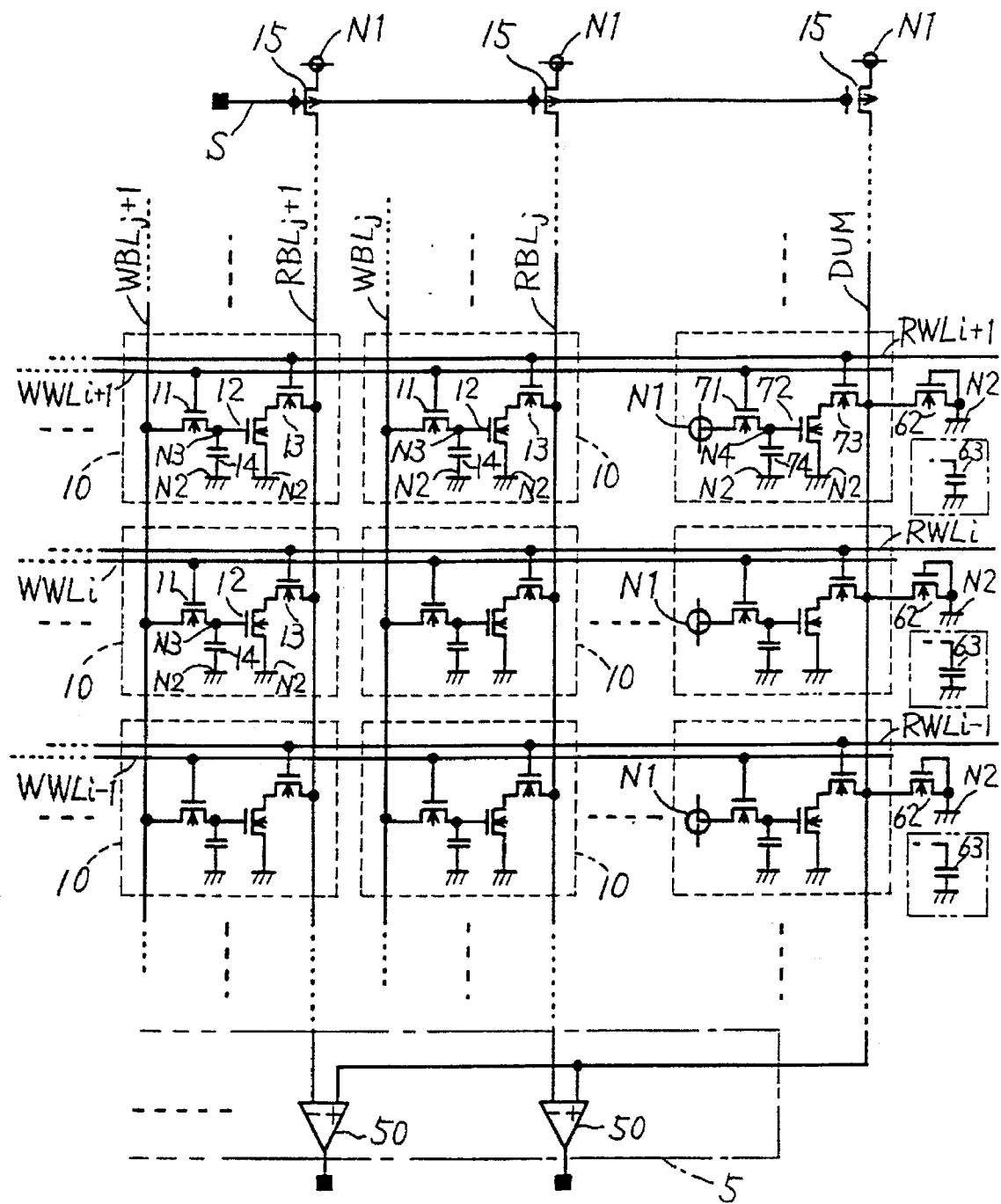
FIG. 5 is a circuit diagram showing the structures of a memory cell array, a dummy memory cell column and a potential comparison circuit provided in a FIFO memory according to a third embodiment of the present invention in detail.

FIG. 5 is a circuit diagram showing the structures of a memory cell array, a dummy memory cell column and a potential comparison circuit provided in a FIFO memory according to the third embodiment of the present invention in detail. Parts which are common with those of FIG. 4 are denoted by the same reference numerals, to omit redundant description.

Referring to FIG. 5, this FIFO memory is different from that of FIG. 4 in a point that N-channel MOS transistors 62 are connected to a dummy read bit line DUM, in place of the capacitor 61.

These transistors 62 are provided in correspondence to dummy memory cells 70 respectively. Each transistor 62 is diode-connected between a node connecting the corresponding dummy memory cell 70 with the dummy read bit line DUM, and a ground node N2.

The transistors 62 connected in the aforementioned manner serve as capacitive means. Alternatively, capacitors 63 may be connected in place of the transistors 62, as shown in FIG. 5.

In the FIFO memory according to the third embodiment, the capacitance value of the dummy read bit line DUM is rendered larger than that of each read bit line RBLj, similarly to the second embodiment.

In the FIFO memory according to the third embodiment, therefore, characteristics of the read bit line RBLj and the dummy read bit line DUM in reading are similar to those shown in FIG. 3. Thus, an effect which is similar to that of the second embodiment can be attained. Namely, it is possible to implement increase of the read rate, stabilization of the read operation and reduction of the chip area similarly to the second embodiment, by connecting the N-channel MOS transistors 62 or the capacitors 63 to the dummy read bit line DUM.

Fourth Embodiment

A fourth embodiment of the present invention is now described. In the fourth embodiment, the number of read bit lines RBLj whose potentials are compared with that of one dummy read bit line DUM is so set as to attain an effect similar to those of the first to third embodiments, in consideration of parasitic input capacitance values of differential amplifiers 50 provided in a potential comparison circuit 5.

In the first to third embodiments, parasitic input capacitances of the differential amplifiers 50 are not particularly taken in consideration. In a FIFO memory according to the fourth embodiment, on the other hand, such input capacitances are taken into consideration.

Figure 6:
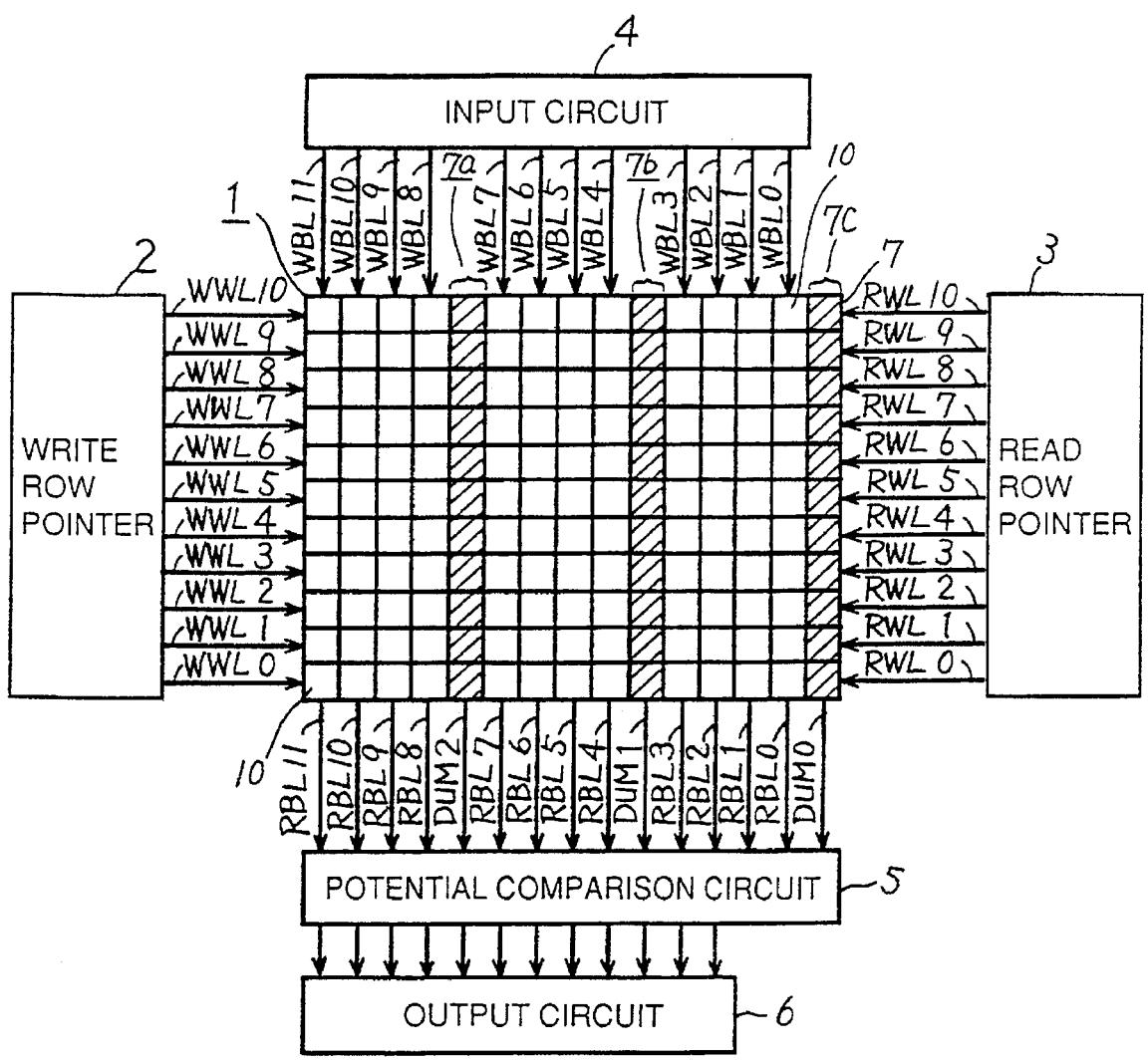
FIG. 6 is a block diagram schematically showing the structure of a FIFO memory according to a fourth embodiment of the present invention.

FIG. 6 is a block diagram schematically showing the structure of the FIFO memory according to the fourth embodiment. Parts which are common to those shown in FIG. 1 are denoted by the same reference numerals, to omit redundant description.

Referring to FIG. 6, this FIFO memory is different from that shown in FIG. 1 in a point that dummy memory cell columns 7a, 7b and 7c are provided each in correspondence to a prescribed number of columns of memory cells 10. In the fourth embodiment, each dummy memory cell column is provided every four columns of memory cells, for example.

Figure 7:
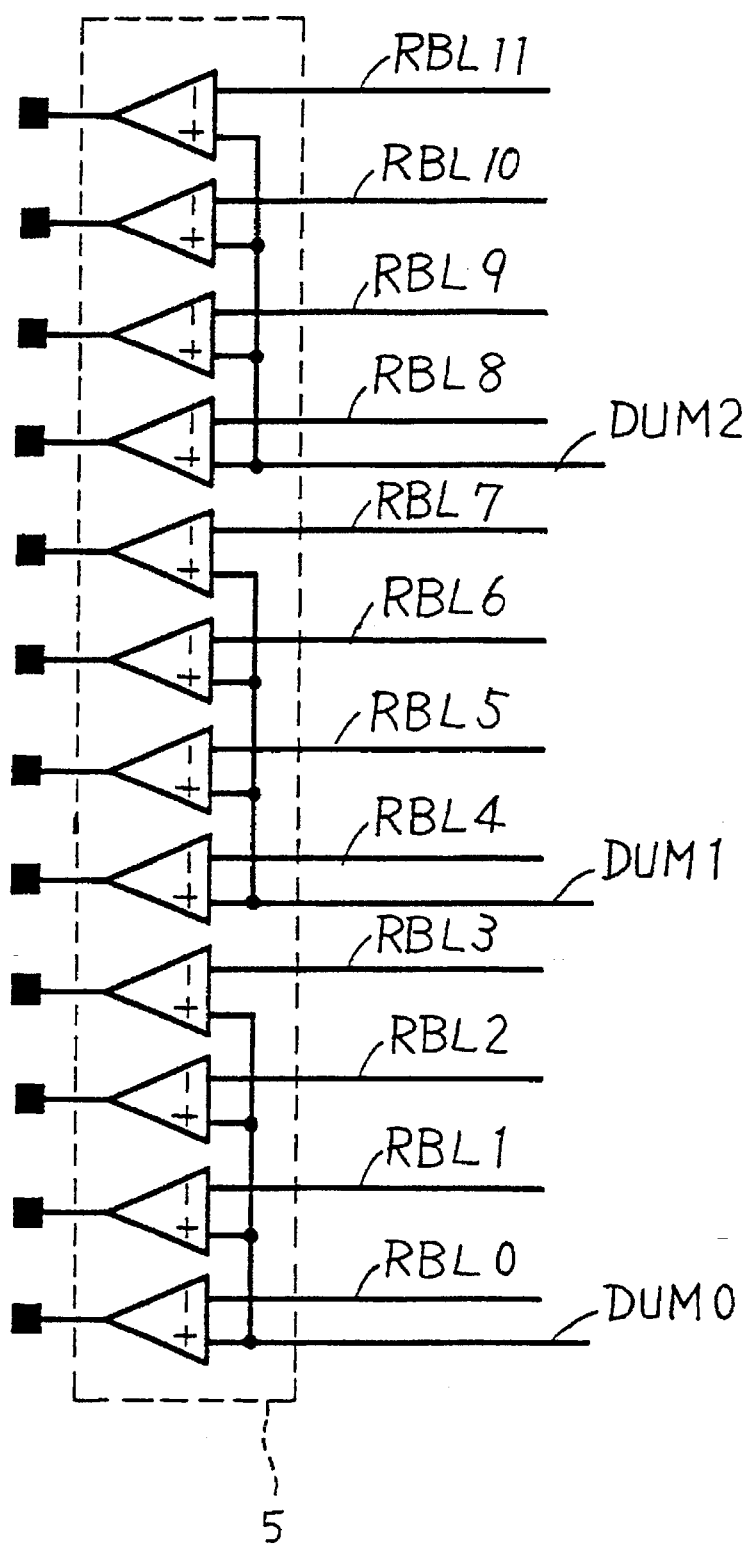
FIG. 7 is a circuit diagram of a potential comparison circuit provided in the FIFO memory according to the fourth embodiment of the present invention.

FIG. 7 is a circuit diagram of a potential comparison circuit 5 provided in the FIFO memory according to the fourth embodiment. Referring to FIG. 7, each read bit line RBLj is connected to a non-inversion input terminal of a corresponding differential amplifier 50. Each of dummy read bit lines DUM0 to DUM3 corresponding to the dummy memory cell columns 7a to 7c respectively corresponds to four differential amplifiers 50, and is connected to non-inversion input terminals of the corresponding differential amplifiers 50.

Thus, each column of dummy memory cells 70 are provided every prescribed number of columns of memory cells 10 so that potentials thereof are compared with each other, in order to attain potential reduction characteristics which are similar to those shown in FIG. 3 by increasing the capacitance of each dummy read bit line DUM beyond that of each read bit line RBLj in consideration of the input capacitance values of the differential amplifiers 50.

In employment of such a structure, it is possible to adjust reduction rates of the respective potentials of the dummy read bit lines DUM0 to DUM3 by changing the number of the read bit lines RBLj corresponding to each dummy read bit line DUM. The reason for this is now described.

It is assumed that the input capacitance of each differential amplifier 50 is 0.1 pF and the capacitance of each of the read bit lines RBLj and the dummy read bit lines DUM0 to DUM3 (excluding the input capacitance of the differential amplifier 50) is 0.9 pF.

In order to set the potential reduction rate of each dummy read bit line DUM at ½ that of each read bit line RBLj in this case, one column of (at least one) dummy memory cell 70 may be provided for 10 columns of (at least 10) memory cells 10. In other words, each dummy read bit line DUM may correspond to 10 read bit lines RBLj.

In this case, the total parasitic capacitance of each read bit line RBLj is 1 pF, while that of each dummy read bit line DUM is 1.9 pF. Thus, the capacitance of each dummy read bit line DUM is about twice that of each read bit line RBLj. Therefore, the potential reduction rate of the dummy read bit line DUM is ½ that of the read bit line RBLj, as clearly understood from the above equation (1).

In the FIFO memory according to the fourth embodiment, as hereinabove described, characteristics which are similar to those shown in FIG. 3 are attained in reading, whereby it is possible to implement increase of the read rate, stabilization of the read operation and reduction of the chip area, similarly to the first to third embodiments.

In the FIFO memory according to the fourth embodiment, further, it is possible to adjust the potential reduction rate of each dummy bit line in reading, by changing the number of the read bit lines corresponding to each dummy read bit line.

Fifth Embodiment

A fifth embodiment of the present invention is now described. According to the fifth embodiment, it is possible to read storage data from memory cells 10 on the basis of results of comparison of potentials of read bit lines RBLj and a dummy read bit line DUM, and to fix the potentials of the read bit lines RBLj and the dummy read bit line DUM finally at different levels.

In each of the first to fourth embodiments, each read bit line RBLj and each dummy read bit line DUM are previously precharged to thereafter read data in reading.

When the FIFO memory performing such an operation is driven at a low speed, however, both of the potentials of the read bit line RBLj and the dummy read bit line DUM may be equalized with the ground potential VSS. As to such a state, consideration may be made on the potentials of the read bit line RBLj and the dummy read bit line DUM in such a case that the time t is infinite in the characteristics shown in FIG. 3, for example.

In this case, no difference is caused between the potentials, and hence the FIFO memory may not correctly operate. The fifth embodiment is adapted to solve this problem.

Figure 8:
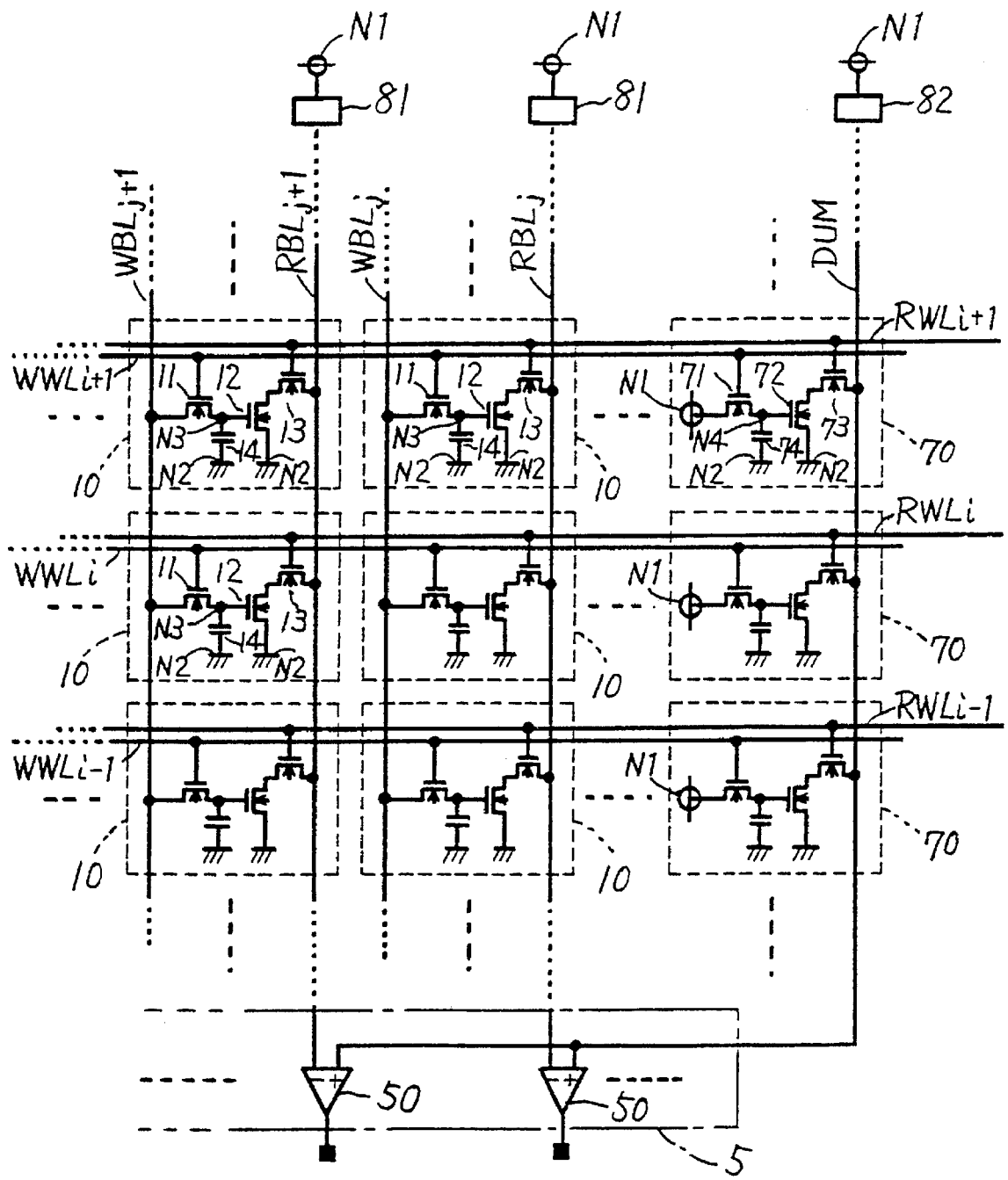
FIG. 8 is a circuit diagram showing the structures of a memory cell array, a dummy memory cell column and a potential comparison circuit provided in a FIFO memory according to a fifth embodiment of the present invention in detail.

FIG. 8 is a circuit diagram showing the structures of a memory cell array, a dummy memory cell column and a potential comparison circuit provided in a FIFO memory according to the fifth embodiment of the present invention in detail. Parts which are common with those of FIG. 4 are denoted by the same reference numerals, to omit redundant description.

Referring to FIG. 8, this FIFO memory is different from that of FIG. 4 in a point that no capacitor 61 is provided but load resistance circuits 81 and 82 are provided in place of the precharge transistors 15.

Each of the load resistance circuits 81 and 82 is formed by a passive element such as a wiring resistor or a diffused resistor, or a active element such as a transistor, for example.

Each load resistance circuit 81 is provided in correspondence to each read bit line RBLj. Each load resistance circuit 81 is connected between a source node N1 and the corresponding read bit line RBLj. On the other hand, the load resistance circuit 82 is connected between a source node N1 and a dummy read bit line DUM. The resistance value of the load resistance circuit 82 is set to be smaller than that of each load resistance circuit 81.

Figure 9:
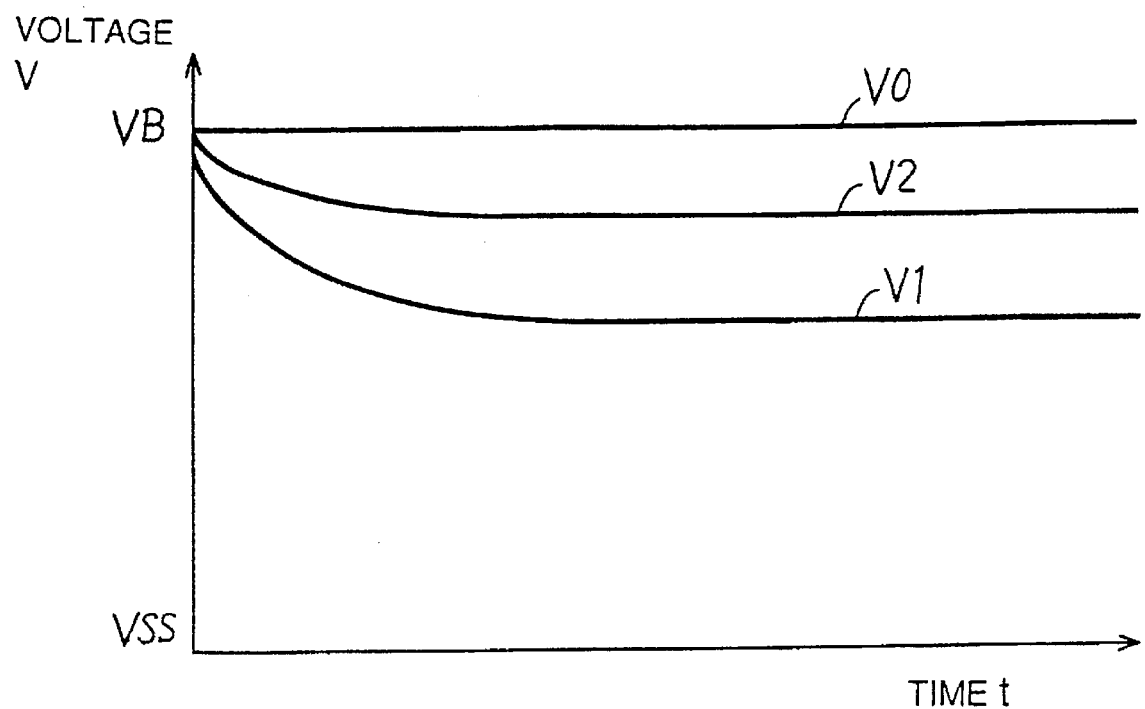
FIG. 9 is a graph showing the relation between potentials of a read bit line and a dummy bit line in a read operation of the FIFO memory according to the fifth embodiment of the present invention.

The operations are now described. FIG. 9 is a graph showing the relation between potentials of each read bit line RBLj and the dummy read bit line DUM in a read operation of the FIFO memory according to the fifth embodiment. This graph corresponds to the aforementioned graph of FIG. 3.

This FIFO memory carries out no precharging in advance of reading, since the load resistance circuits 81 and 82 are provided in place of precharge transistors.

Thus, this FIFO memory carries out the reading operation with no precharging. In this reading, the potential V0 or V1 of each read bit line RBLj is decided by drivability of a transistor 12 of each memory cell 10 and the impedance of each load resistance circuit 81. Further, the potential V2 of the dummy read bit line DUM in reading is decided by drivability of a transistor 72 of each dummy memory cell 70 and impedance of the load resistance circuit 82.

When "1" level storage data is read from the memory cell 10, therefore, the potential of the dummy read bit line DUM which is connected with the load resistance circuit 82 having smaller impedance is regularly higher than that of the read bit line RBLj which is connected with the load resistance circuit 81 having larger impedance.

The potential V2 of the dummy read bit line DUM is finally fixed at a level which is higher than the potential of the read bit line RBLj. On the other hand, the potential V1 of the read bit line RBLj is fixed at a level which is lower than the fixed potential of the dummy read bit line DUM.

When "0" level storage data is read from the memory cell 10, on the other hand, the potential V0 of the read bit line RBLj is fixed at a level which is higher than the fixed potential of the dummy read bit line DUM.

Thus, the FIFO memory according to the fifth embodiment causes a potential difference between the read bit line RBLj and the dummy read bit line DUM in reading due to the provision of the load resistance circuits 81 and 82, and carries out the read operation on the basis of the comparison result of these potentials.

In the FIFO memory according to the fifth embodiment, therefore, it is possible to implement increase of the read rate, stabilization of the read operation and reduction of the chip area, similarly to the first to fourth embodiments.

In the FIFO memory according to the fifth embodiment, further, the read bit line RBLj and the dummy read bit line DUM can be finally fixed at different potentials, due to the provision of the load resistance circuits 81 and 82. Thus, a low-speed operation of the FIFO memory can be stabilized.

Sixth Embodiment

A sixth embodiment of the present invention is now described. In the sixth embodiment, a speed for increasing the potential of each read bit line RBLj to a level "1" is improved in the FIFO memory according to the fifth embodiment.

When the load resistance circuits 81 and 82 are provided as in the FIFO memory according to the fifth embodiment, the following problem may be caused:

When the resistance value of the load resistance circuit 81 for each read bit line RBLj is increased, a speed of response for increasing the potential of the read bit line RBLj to a level "1" is reduced.

When the resistance value of the load resistance circuit 81 for each read bit line RBLj is reduced, on the other hand, the amount of potential reduction of the read bit line RBLj to a level "0" is reduced. Therefore, the difference between the potentials of the read bit line RBLj in case of reading "1" and "0" level storage data from each memory cell 10 is reduced. Thus, it is difficult to discriminate the states of reading the "1" and "0" level data from each other.

Figure 10:
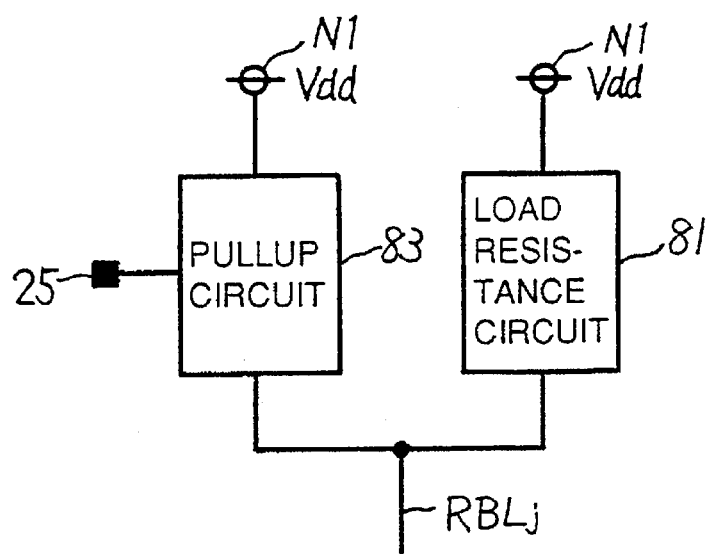
FIG. 10 is a block diagram showing a part related to a load resistance circuit provided in a FIFO memory according to a sixth embodiment of the present invention.

The sixth embodiment is adapted to solve this problem. FIG. 10 is a block diagram showing a portion related to each load resistance circuit 81 of an FIFO memory according to the sixth embodiment.

This FIFO memory is different from that shown in FIG. 8 in a point that a pullup circuit 83 is connected between a source node N1 and each read bit line RBLj in parallel with the load resistance circuit 81.

The pullup circuit 83 is connected to a clock input node 25, which receives a clock signal for defining a period for driving the pullup circuit 83. Therefore, the pullup circuit 83 operates in response to the clock signal which is received by the clock input node 25, to pull up the potential of the read bit line RBLj.

The pullup circuit 83 operates only for pulling up the read bit line RBLj, whereby the FIFO memory according to the sixth embodiment operates similarly to that of the fifth embodiment, except the pullup period for the read bit line RBLj. Therefore, the FIFO memory according to the sixth embodiment can increase the pullup speed for the read bit line RBLj, in addition to the effect attained in the FIFO memory according to the fifth embodiment.

Seventh Embodiment

A seventh embodiment of the present invention is now described. In order to solve the problem in the low-speed read operation described with reference to the fifth embodiment, it is necessary to finally fix the potentials of each read bit line RBLj and the dummy read bit line DUM respectively. The seventh embodiment can fix the potentials.

A FIFO memory according to the seventh embodiment, which executes a data read operation after precharging each read bit line RBLj and a dummy read bit line DUM, can fix the potentials of these bit lines RBLj and DUM respectively.

Figure 11:
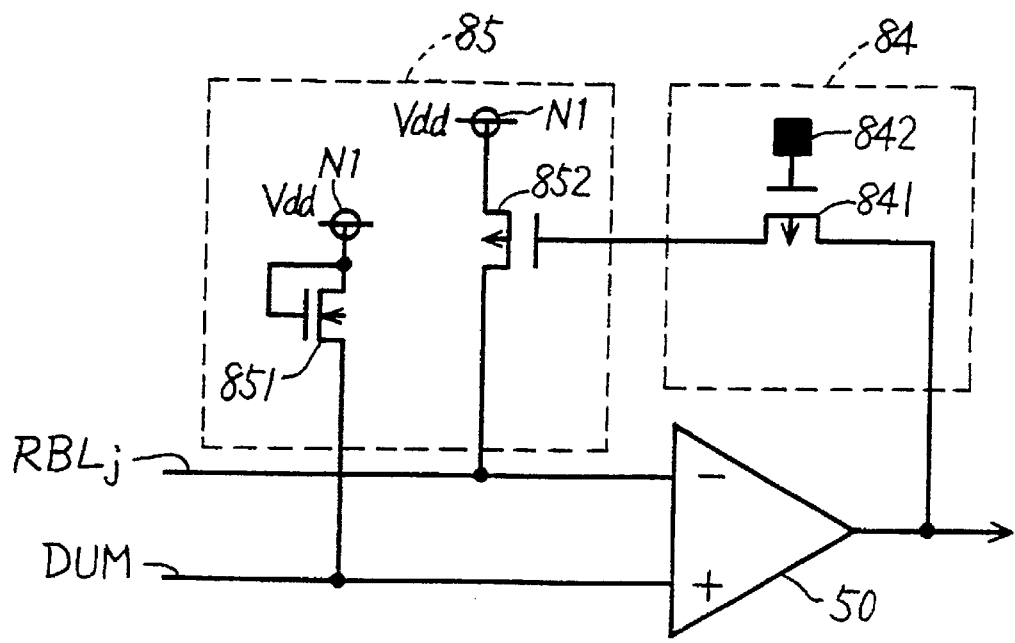
FIG. 11 is a circuit diagram showing a portion for fixing potentials of a read bit line and a dummy bit line provided in a FIFO memory according to a seventh embodiment of the present invention.

FIG. 11 is a circuit diagram showing a portion for fixing the potentials of the read bit line RBLj and the dummy bit line DUM in the FIFO memory according to the seventh embodiment.

Referring to FIG. 11, the FIFO memory includes a control signal generation circuit 84 and a potential locking circuit 85 as circuits for fixing the potentials of the read bit line RBLj and the dummy read bit line DUM. The control signal generation circuit 84 and the potential locking circuit 85 are provided in the FIFO memory shown in FIGS. 2, 4, 5 or 6, for example.

The control signal generation circuit 84 includes a P-channel MOS transistor 841 and a clock signal input node 842. The potential locking circuit 85 includes an N-channel MOS transistor 851 and a P-channel MOS transistor 852.

The transistor 851 is connected between a source node N1 and the dummy read bit line DUM. This transistor 851 is diode-connected. On the other hand, the transistor 852 is connected between a source node N1 and the read bit line RBLj.

The clock signal input node 842 receives a clock signal which defines timing for fixing the potential of the read bit line RBLj. The transistor 841 is connected between an output node of each differential amplifier 50 of the potential comparison circuit 5 and a gate electrode of the transistor 852. A gate electrode of this transistor 841 is connected to the clock signal input node 842.

The operations are now described. In a read operation, the read bit line RBLj and the dummy read bit line DUM are precharged. Storage data are read from each memory cell 10 and each dummy memory cell 70.

When storage data of a level "0" is read from the memory cell 10, the potential of the read bit line RBLj may be gradually reduced toward the ground potential VSS at a low speed due to a leakage current of a capacitor or the like. Therefore, a malfunction may be caused if the potential of the read bit line RBLj is reduced as such.

In this case, however, the output signal of the differential amplifier 50 is at a level "0" since the potential of the read bit line RBLj is higher than that of the dummy read bit line DUM. Therefore, the transistor 852 is turned on when the transistor 841 is turned on in response to the clock signal. Thus, the read bit line RBLj is fixed at the source potential Vdd.

In the read operation, the potential of the dummy read bit line DUM is reduced toward the ground potential VSS, and a malfunction may be caused if the former reaches the latter.

In this case, however, the transistor 851 is turned on when the potential of the dummy read bit line DUM reaches a level (Vdd–Vth) which is lower than the source potential Vdd by a threshold voltage Vth of the transistor 851. Thus, the potential of the dummy read bit line DUM is fixed at the level Vdd–Vth. Thus, no malfunction takes place.

When storage data of a level "1" is read from the memory cell 10, on the other hand, the potential of the read bit line RBLj is reduced toward the ground potential VSS at a high speed. In this case, the output signal of the differential amplifier 50 is regularly at a level "1". Thus, the transistor 852 is in an OFF state. When the storage data of the level "1" is read, therefore, the potential of the read bit line RBLj is not fixed.

Thus, it is not necessary to fix the potential of the read bit line RBLj in the operation of reading the storage data of the level "1" for the following reason: The potential of the dummy read bit line DUM is finally fixed as described above, whereby a potential difference necessary for reading the data is caused without fixing the potential of the read bit line RBLj.

In the FIFO memory according to the seventh embodiment, therefore, the potentials V0 and V2 of the read bit line RBLj and the dummy read bit line DUM for reading the "0" storage data from the memory cell 10 are in characteristics similar to those shown in FIG. 9. On the other hand, the potential V1 of the read bit line RBLj for reading the "1" storage data from the memory cell 10 is in characteristics similar to those shown in FIG. 3.

In the FIFO memory according to the seventh embodiment, as hereinabove described, the potentials of the read bit line RBLj and the dummy read bit line DUM are finally fixed in the case of reading the "0" storage data, whereby an effect which is similar to that of the fifth embodiment can be attained. Namely, operations in a low-speed operation of the FIFO memory can be stabilized.

Eighth Embodiment

An eighth embodiment of the present invention is now described. A FIFO memory according to the eighth embodiment can fix potentials of each read bit line RBLj and a dummy read bit line DUM at optimum timing with no requirement for the clock signal shown in a seventh embodiment.

When the potential of the read bit line RBLj is fixed in response to the clock signal as in the seventh embodiment, it is necessary to adjust the timing of the clock signal of each word, i.e., the timing for fixing the potential of the read bit line RBLj, in response to the number of on-chip words.

Figure 12:
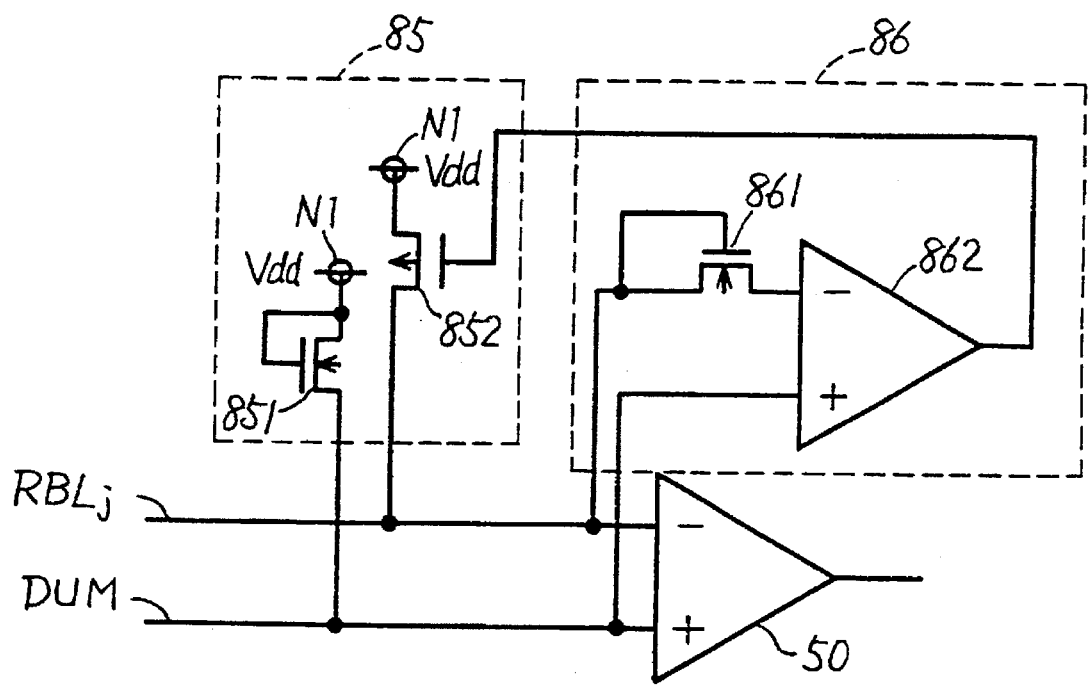
FIG. 12 is a circuit diagram showing a portion for fixing potentials of a read bit line and a dummy read bit line provided in a FIFO memory according to an eighth embodiment of the present invention.

FIG. 12 is a circuit diagram showing a portion for fixing the potentials of the read bit line RBLj and the dummy read bit line DUM in the FIFO memory according to the eighth embodiment. Parts which are common with those of FIG. 11 are denoted by the same reference numerals, to omit redundant description.

Referring to FIG. 12, this FIFO memory is different from that of FIG. 11 in the structure of a control signal generation circuit 86. The control signal generation circuit 86 and a potential locking circuit 85 are provided for fixing the potentials of the read bit line RBLj and the dummy read bit line DUM.

The control signal generation circuit 86 and the potential locking circuit 85 are provided in the FIFO memory shown in FIGS. 2, 4, 5 or 6, for example, similarly to the seventh embodiment.

The control signal generation circuit 86 includes an N-channel MOS transistor 861 and a differential amplifier 862. The differential amplifier 862 has a non-inversion input terminal which is connected to the dummy read bit line DUM, and an inversion input terminal which is connected to the read bit line RBLj through the transistor 861. The transistor 861 is diode-connected.

The operations are now described. The potential of the dummy read bit line DUM is fixed through an operation which is similar to that of the seventh embodiment. On the other hand, the potential of the read bit line RBLj is fixed as follows:

When "0" storage data is read, the potential of the read bit line RBLj is gradually reduced, while that of the dummy read bit line DUM is reduced at a high speed. In an initial stage of the read operation, the potential difference between the read bit line RBLj and the dummy read bit line DUM is small and hence an output signal of the transistor 862 is at a level "1". Therefore, the potential of the read bit line RBLj is not fixed in the initial stage of the read operation.

When the potential of the dummy read bit line DUM is lower than that of the read bit line RBLj by a threshold voltage Vth of the transistor 861, the output signal of the differential amplifier 862 is zeroed. Thus, the transistor 852 is turned on, so that the potential of the read bit line RBLj is fixed at a source potential Vdd.

Namely, the potential of the read bit line RBLj is automatically fixed at the source potential Vdd when the potential of the dummy read bit line DUM is reduced below that of the read bit line RBLj by the threshold voltage Vth.

When "1" level storage data is read, on the other hand, the potential of the read bit line RBLj is reduced at a high speed. In this case, the potential of the read bit line RBLj is regularly lower than that of the dummy read bit line DUM, and hence the output signal of the differential amplifier 862 is regularly at a level "1". Therefore, the transistor 852 is turned off and the potential of the read bit line RBLj is not fixed.

In the FIFO memory according to the eighth embodiment, as hereinabove described, the potentials of the read bit line RBLj and the dummy read bit line DUM are in characteristics which are similar to those in the seventh embodiment. In the FIFO memory according to the eighth embodiment, therefore, an effect which is similar to that of the seventh embodiment can be attained. Namely, operations in a low-speed operation of the FIFO memory can be stabilized.

In the eighth embodiment, further, the timing for fixing the potential of the read bit line RBLj is automatically decided, whereby no supply of a clock signal is required dissimilarly to the seventh embodiment, and the control is simplified.

In the FIFO memory according to the eighth embodiment, the diode-connected N-channel MOS transistor 861 is provided between the read bit line RBLj and the inversion input terminal of the differential amplifier 862. Alternatively, the transistor 861 may be replaced by a diode-connected P-channel MOS transistor and a diode utilizing a p-n junction. If a plurality of such diode functions are necessary, elements having such diode functions may be combined with each other.

Ninth Embodiment

A ninth embodiment of the present invention is now described. The ninth embodiment is applied to a multivalue storage memory for reading data stored in each memory cell on the basis of a result of comparison between potentials of each read bit line RBLj and a dummy read bit line DUM. The multivalue storage memory according to the ninth embodiment of the present invention is an FIFO memory for storing at least quaternary data.

Figure 13:
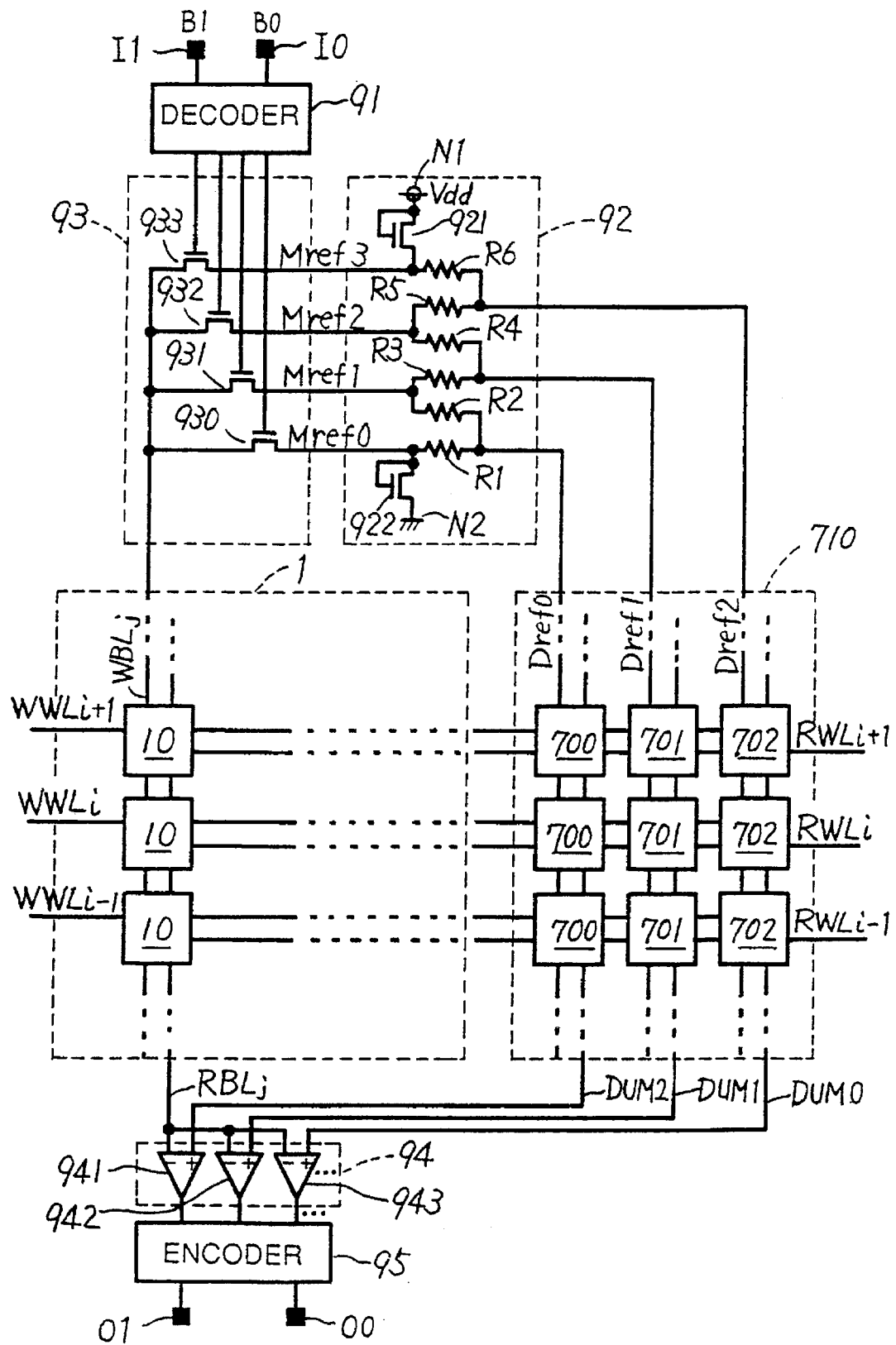
FIG. 13 is a circuit diagram showing the structure of a multivalue storage FIFO memory according to a ninth embodiment of the present invention.

FIG. 13 is a circuit diagram of the multivalue storage FIFO memory according to the ninth embodiment.

Referring to FIG. 13, this FIFO memory includes a memory cell array 1, a dummy memory cell group 710, a decoder 91, a reference potential generation circuit 92, a switching circuit 93, a potential comparison circuit 94 and an encoder 95.

The decoder 91 has two digital signal input nodes I1 and I0, and decodes data B1 and B0 which are inputted from the digital signal input nodes I1 and I0 respectively for generating control signals.

The reference potential generation circuit 92 includes N-channel MOS transistors 921 and 922, and six resistances R1 to R6 which are connected in series with each other. The resistances R1 to R6 form a resistance array.

In this reference potential generation circuit 92, the transistor 922, the resistances R1 to R6 and the transistor 921 are serially connected between a ground node N2 and a source node N1. Both of the transistors 921 and 922 are diode-connected.

The reference potential generation circuit 92 generates the following seven levels of reference potentials:

Reference potentials Mref0, Mref1, Mref2 and Mref3 are generated from nodes between the transistor 922 and the resistance R1, between the resistances R2 and R3, between the resistances R4 and R5, and between the resistance R6 and the transistor 921 respectively.

Further, reference potentials Dref0, Dref1 and Dref2 are generated from nodes between the resistances R1 and R2, between the resistances R3 and R4, and between the resistances R5 and R6 respectively.

The transistor 921 is provided on the source node N1 side, in consideration of potential reduction of a threshold voltage Vth by a transistor 11 (see FIG. 2) in each memory cell 10. Further, the transistor 922 is provided on the ground node N2 side in order to guarantee a minimum potential for turning on a transistor 12 (see FIG. 2) in each memory cell 10.

The switching circuit 93 includes four N-channel MOS transistors 930 to 933. Each of these transistors 930 to 933 has a gate which receives the control signal outputted from the decoder 91.

The transistor 930 is connected between each write bit line WBLj and the node between the transistor 922 and the resistance R1. The transistor 931 is connected between the write bit line WBLj and the node between the resistances R2 and R3. The transistor 932 is connected between the write bit line WBLj and the node between the resistances R4 and R5. The transistor 933 is connected between the write bit line WBLj and the node between the resistance R6 and the transistor 921.

The memory cell array 1 includes a plurality of memory cells 10 which are arranged in a plurality of rows and a plurality of columns, similarly to the embodiment shown in FIG. 2.

The dummy memory cell group 710 includes a plurality of dummy memory cells 700, 701 and 702, which are arranged in three columns. Each of the dummy memory cells 700 to 702 is identical in structure to the dummy memory cell 70 shown in FIG. 2. In this dummy memory cell group 710, the number of the dummy memory cells forming each column is identical to the row number (word number) of the memory cells 10 in the memory cell array 1.

In the dummy memory cell group 710, each dummy memory cell 700 is supplied with the reference potential Dref0 as dummy data. Each dummy memory cell 701 is supplied with the reference potential Dref1 as dummy information. Each dummy memory cell 702 is supplied with the reference potential Dref2 as dummy information.

Storage data read from the dummy memory cells 700 are transmitted to a dummy read bit line DUM2. Those read from the dummy memory cells 701 are transmitted to a dummy read bit line DUM1. Further, those read from the dummy memory cells 702 are transmitted to a dummy read bit line DUM0.

The potential comparison circuit 94 includes three differential amplifiers 941, 942 and 943, in correspondence to each read bit line RBLj. In each of the differential amplifiers 941 to 943, the corresponding read bit line RBLj is connected to an inversion input node. The dummy read bit lines DUM2, DUM1 and DUM0 are connected to non-inversion input nodes of the differential amplifiers 941, 942 and 943 respectively.

The encoder 95 receives output signals of the differential amplifiers 941 to 943 corresponding to each read bit line RBLj. The encoder 95 encodes the received output signals of the differential amplifiers 941 to 943, and outputs the results from output nodes O1 and O0.

Operations of the FIFO memory are now described.

A write operation is first described. The reference potentials Mref0 to Mref3 and Dref0 to Dref3 which are generated from the reference potential generation circuit 92 have the following values (2) to (8), where Vdd represents a source potential, VSS represents a ground potential, and Vth represents a threshold voltage of one transistor:

$$Mref0 = Vth + (Vdd - VSS - 2Vth) \times 0/6 \quad (2)$$

$$MRef1 = Vth + (Vdd - VSS - 2Vth) \times 2/6 \quad (3)$$

$$Mref2 = Vth + (Vdd - VSS - 2Vth) \times 4/6 \quad (4)$$

$$Mref3 = Vth + (Vdd - VSS - 2Vth) \times 6/6 \quad (5)$$

$$Dref0 = Vth + (Vdd - VSS - 2Vth) \times 1/6 \quad (6)$$

$$Dref1 = Vth + (Vdd - VSS - 2Vth) \times 3/6 \quad (7)$$

$$Dref2 = Vth + (Vdd - VSS - 2Vth) \times 5/6 \quad (8)$$

This FIFO memory receives 8-bit data, for example. The digital signal input node I0 receives the least significant bit signal B0, while the digital signal input node I1 receives a subsequent bit signal B1. In response to these bit signals B0 and B1, the decoder 91 generates control signals as follows:

The transistor 930 is turned on when both of the signals B1 and B0 are at levels "0". The transistor 931 is turned on when the signal B1 is at a level "0" and the signal B0 is at a level "1". The transistor 932 is turned on when the signal B1 is at a level "1" and the signal B0 is at a level "0". The transistor 933 is turned on when both of the signals B1 and B0 are at levels "1".

Such control signals are supplied to the switching circuit 93. Thus, the switching circuit 93 selectively supplies four types of analog voltages to the memory cells 10 in correspondence to code information indicated by the signals B1 and B0, so that the analog voltages are written therein. Namely, each memory cell 10 stores 2-bit data. The 2-bit data is indicated by a quaternary analog voltage.

In the dummy memory cell group 710, dummy information is written as follows: The reference potentials Dref0, Dref1 and Dref2 are written in the dummy memory cells 700, 701 and 702 respectively.

Thus, the potentials Dref0, Dref1 and Dref2 at three intermediate levels of the four levels of the reference potentials Mref0 to Mref3 which can be written in the memory cells 10 are written in the dummy memory cells 700 to 702 respectively.

A read operation is now described. In the read operation, a potential which is responsive to storage data read from the corresponding memory cell 10 is transmitted to each read bit line RBLj.

Potentials which are responsive to storage data read from the corresponding memory cells 700, 701 and 702 are transmitted to the dummy read bit lines DUM2, DUM1 and DUM0 respectively.

In the potential comparison circuit 94, each of the differential amplifiers 941 to 943 compares the potentials of the corresponding read bit line RBLj and the corresponding dummy read bit line DUM (0~2) with each other, so that the result is encoded in the encoder 95 and outputted.

Namely, the potentials of the respective read bit lines RBLj are compared with those of the three dummy read bit lines DUM0 to DUM2 serving as determinant reference potentials in the potential comparison circuit 94.

The levels of the output signals of the differential amplifiers 941 to 943 indicating the results of the comparison define code information indicating the results of reading of 2-bit (quaternary) storage data from the memory cells 10. The encoder 95 encodes the code information, thereby outputting read data which can take quaternary values from the output nodes O1 and O0.

Thus, the FIFO memory according to the ninth embodiment reads data on the basis of the results of comparison between the potentials of the read bit lines RBLj and the dummy read bit lines DUM0 to DUM2, whereby it is possible to implement increase of the read rate and stabilization of the read operation, similarly to the first to fifth embodiments.

Further, the FIFO memory according to the ninth embodiment can also implement reduction of the chip area, for the following reason: In the quaternary storage FIFO memory having the aforementioned structure, the number of the memory cells 10 forming the memory cell array 1 can be halved as compared with that of the memory cells provided in the conventional FIFO memory shown in FIG. 23, since double data can be written in each memory cell 10 as compared with the conventional memory cell.

The FIFO memory according to the ninth embodiment can be implemented by newly adding circuits such as the dummy memory cell group 710, the decoder 91, the reference potential generation circuit 92, the switching circuit 93, the encoder 95 etc. to the FIFO memory shown in FIG. 23.

The chip area which is increased by addition of these circuits is sufficiently small as compared with that reduced by halving the number of the memory cells. In the FIFO memory according to the ninth embodiment, therefore, the chip area can be sufficiently reduced as compared with the conventional one.

According to the ninth embodiment, the dummy memory cells 700 to 702 receiving the reference potentials Dref0 to Dref2 respectively are provided in a number identical to the word number of the memory cell array 1, in consideration of influences exerted by current leakage in storage nodes of the dummy memory cells 700 to 702 and switching noises.

If no high accuracy is required in reading, therefore, it is not necessary to provide the dummy memory cells 700 to 702 in the number corresponding to the word number. Thus, the dummy memory cell group 710 may be provided with at least three dummy memory cells 700, 701 and 702.

Tenth Embodiment

A tenth embodiment of the present invention is now described. In the tenth embodiment of the present invention, the memory shown in any of the first to eighth embodiments is applied to a DRAM which can read data at random.

While each of the first to eighth embodiments is applied to a FIFO memory, the present invention is not restricted to a FIFO memory but is also applicable to a DRAM.

Figure 14:
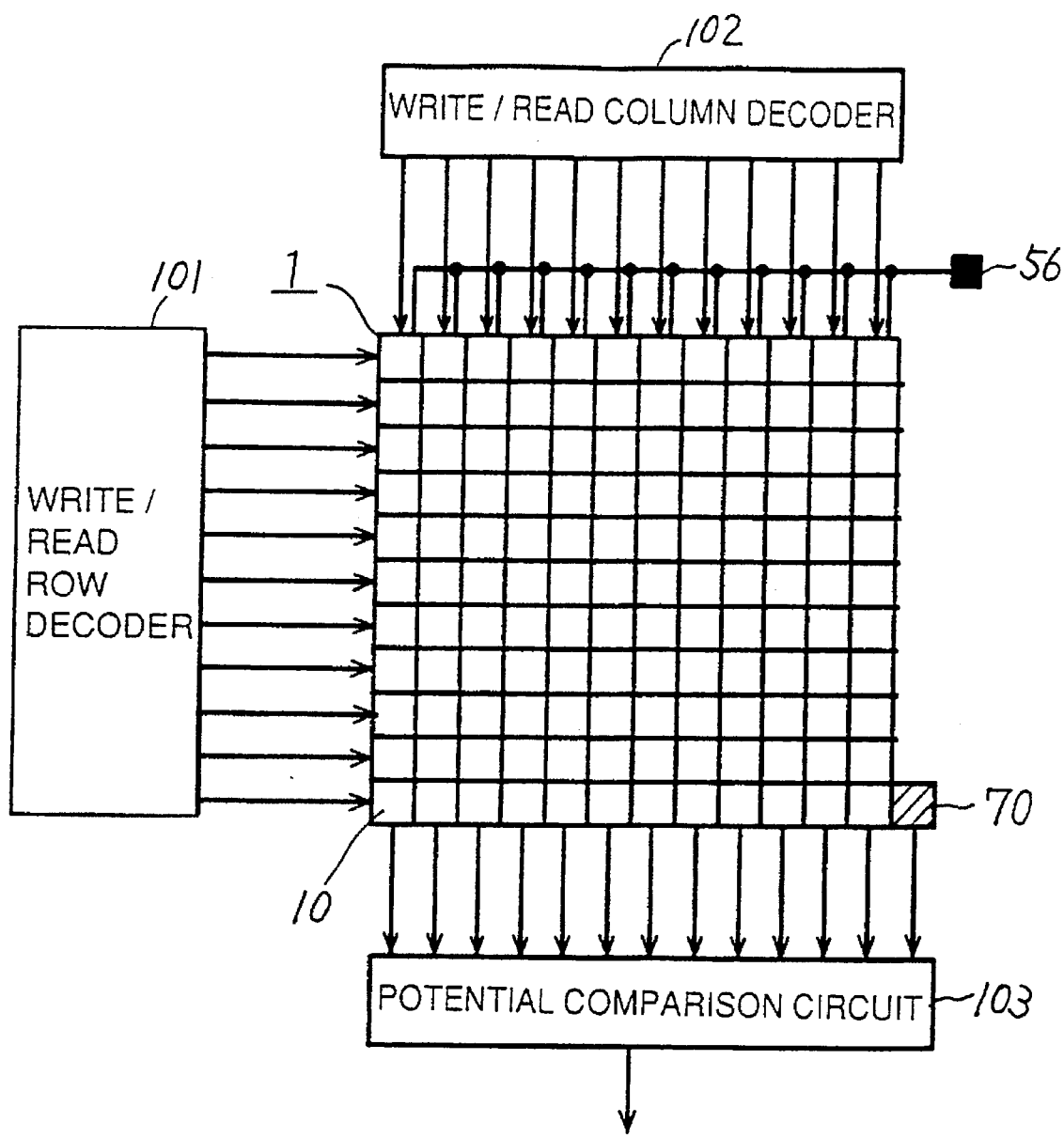
FIG. 14 is a block diagram schematically showing the structure of a DRAM according to a tenth embodiment of the present invention.

FIG. 14 is a block diagram schematically showing the structure of the DRAM according to the tenth embodiment. Referring to FIG. 14, this DRAM includes a write/read row decoder 101, a write/read column decoder 102, a data input node 56, a memory cell array 1, a dummy memory cell 70 and a potential comparison circuit 103. The memory cell array 1 includes a plurality of memory cells 10 which are arranged in a plurality of rows and a plurality of columns.

Among these elements, the memory cell array 1, the memory cells 10, the dummy memory cell 70 and the potential comparison circuit 103 are similar in structure to those of the first to eighth embodiments respectively. This DRAM is an exemplary memory of 132 (memory cells) by 1 (dummy memory cell) bits.

The data input node 56 receives 1-bit data. The write/read row decoder 101 is adapted to select a row of the memory cells 10, while the write/read column decoder 102 is adapted to select a column of the memory cells 10. The data inputted from the data input node 56 is written in a memory cell 10 which is selected by the write/read row decoder 101 and the write/read column decoder 102.

The data is read from the memory cell 10 which is selected by the write/read row decoder 101 and the write/read column decoder 102. On the other hand, dummy data is read from the dummy memory cell 70.

Similarly to the first to eighth embodiments, the potential comparison circuit 103 compares potentials transmitted to each read bit line and a dummy read bit line respectively with each other, and reads data on the basis of the comparison result.

Also in the DRAM according to the tenth embodiment having the aforementioned structure, an effect which is similar to those of the first to eighth embodiments can be attained.

Eleventh Embodiment

An eleventh embodiment of the present invention is now described. In the eleventh embodiment, the memory structure of the ninth embodiment is applied to a DRAM.

Figure 15:
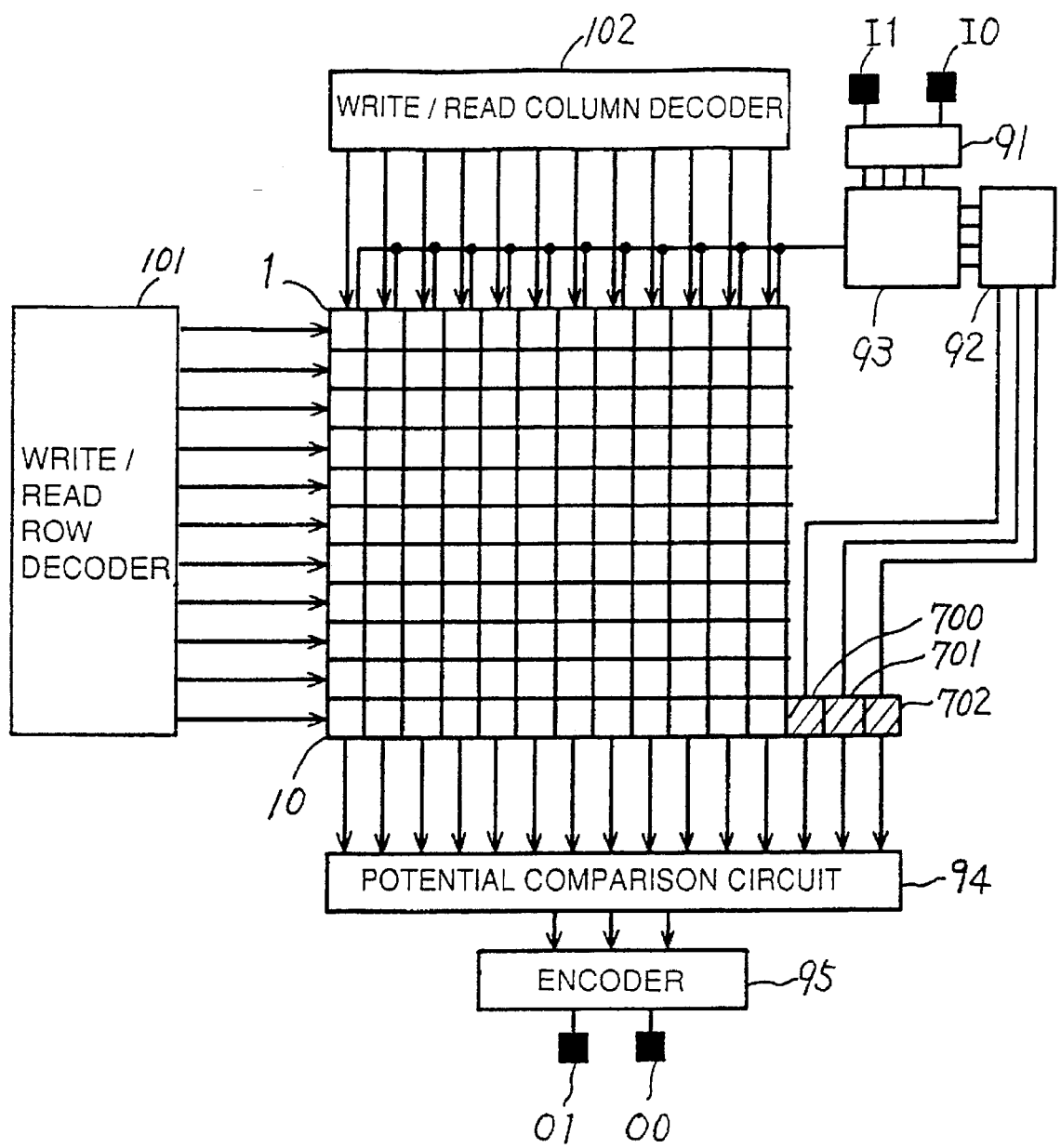
FIG. 15 is a block diagram schematically showing the structure of a DRAM according to an eleventh embodiment of the present invention.

FIG. 15 is a block diagram showing the structure of a multivalue storage DRAM according to the eleventh embodiment. Parts which are common with those shown in FIGS. 13 and 14 are denoted by the same reference numerals, to omit redundant description.

Referring to FIG. 15, the DRAM according to the eleventh embodiment is different from that of FIG. 14 in a point that a potential comparison circuit 94 has a different structure, at least three dummy memory cells 700 to 702 are provided, and a decoder 91, a reference potential generation circuit 92, a switching circuit 93 and an encoder 95 are added.

A memory cell array 1, memory cells 10, the dummy memory cells 700 to 702, the decoder 91, the reference potential generation circuit 92, the switching circuit 93, the potential comparison circuit 94 and the encoder 95 are similar in structure to those of the ninth embodiment shown in FIG. 13 respectively.

Therefore, the memory cells 10 store quaternary data, and the dummy memory cells 700 to 702 store intermediate level data respectively, for example. In reading, data are read on the basis of the results of comparison of the levels of these data.

According to the eleventh embodiment, therefore, an effect which is similar to that of the FIFO memory of the ninth embodiment can be attained in a DRAM.

Twelfth Embodiment

A twelfth embodiment of the present invention is now described. According to the twelfth embodiment, it is possible to control current consumption in the differential amplifier 50 for comparing the potentials of each read bit line RBLj and the dummy read bit line DUM, which is employed in each of the first to eleventh embodiments, from the exterior.

In each of the first to eleventh embodiments, the differential amplifier 50 is employed as a memory sense amplifier. In general, a differential amplifier regularly feeds currents through two paths from a power source to the ground, and makes amplification through the current difference between the two paths. The degree of current consumption in the differential amplifier depends on the speed which is required for the differential amplifier, and larger current consumption is required as the speed is increased.

A FIFO memory is formed by integrating logic circuits on a single chip, and the speed required therefor is varied with its application. Therefore, the current consumption in the differential amplifier is generally decided in response to the maximum speed in target specification, leading to wasteful power consumption upon employment in an application requiring no high speed operation. The twelfth embodiment is adapted to solve this problem.

Figure 16:
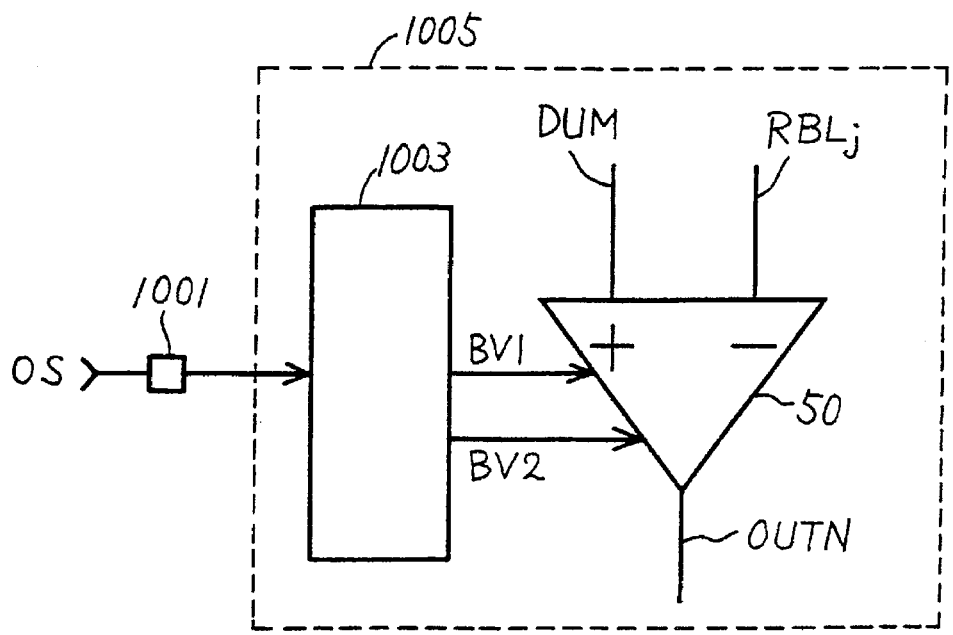
FIG. 16 is a circuit diagram showing a portion for comparing potentials of a read bit line and a dummy read bit line provided in a FIFO memory according to a twelfth embodiment of the present invention.

FIG. 16 is a circuit diagram showing a portion for comparing potentials of a read bit line and a dummy read bit line with each other in a FIFO memory according to the twelfth embodiment.

Referring to FIG. 16, the portion of the FIFO memory for comparing potentials of a read bit line RBLj and a dummy read bit line DUM includes an input terminal 1001, a bias voltage generation circuit 1003, and a differential amplifier 50. The bias voltage generation circuit 1003 and the differential amplifier 50 form a potential comparison unit 1005. The differential amplifier 50 shown in FIG. 16 can be employed as that for the FIFO memory according to each of the first to ninth embodiments, for example. The input terminal 1001 and the bias voltage generation circuit 1003 are provided with respect to the differential amplifier 50. For example, the input terminal 1001 and the bias voltage generation circuit 1003 may be provided for the FIFO memory, or every differential amplifier 50, in arbitrary numbers in response to the design.

The bias voltage generation circuit 1003 comprises an external bias terminal (not shown) for receiving an external voltage signal OS which is inputted from the input terminal 1001. The bias voltage generation circuit 1003 further comprises at least two bias voltage supply terminals (not shown) for transmitting bias voltages to the differential amplifier 50. Referring to FIG. 16, it is assumed that the bias voltage generation circuit 1003 comprises two bias voltage supply terminals (not shown).

Similarly to the first to eleventh embodiments, the dummy read bit line DUM and the read bit line RBLj are connected to a non-inversion input terminal and an inversion input terminal of the differential amplifier 50 respectively. An output signal from the differential amplifier 50 is outputted to an output node OUTN. The differential amplifier 50 receives bias voltage BV1 and BY2 through the two bias voltage supply terminals (not shown) of the bias voltage generation circuit 1003.

The differential amplifier 50 comprises two bias terminals (not shown) receiving the bias voltages BV1 and BV2 respectively. The input terminal 1001 receives the external voltage signal OS, and transmits the same to the bias voltage generation circuit 1003.

The operation is now described. In general, a differential amplifier having two or more bias terminals stably operates only when two or more bias voltages which are inputted through the two or more bias terminals are in constant relation to each other. Therefore, the bias circuit 1003 is adapted to supply the bias voltage BV1 and BV2 capable of stably driving the differential amplifier 50.

The bias voltage generation circuit 1003 generates the bias voltages BV1 and BV2 satisfying conditions for stably driving the differential amplifier 50, in response to the external voltage signal OS which is inputted from the input terminal 1001. The current flowing through the differential amplifier 50 is decided on the base of the value of the bias voltage BV2.

Namely, the current consumption in the differential amplifier 50 can be controlled by the external voltage signal OS, since the bias voltages BV1 and BV2 are controlled by the external voltage signal OS.

Figure 17:
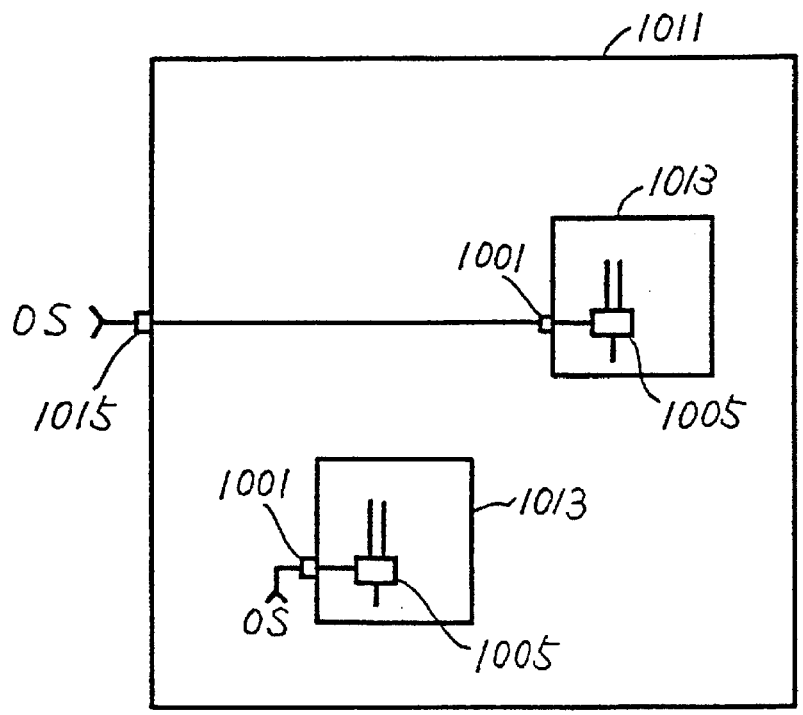
FIG. 17 is a schematic block diagram showing the FIFO memory according to the twelfth embodiment provided in an LSI.

FIG. 17 is a schematic block diagram showing FIFO memories according to the twelfth embodiment, which are provided in an LSI 1011.

Referring to FIG. 17, the LSI 1011 is provided with two FIFO memories 1013 according to the twelfth embodiment. Each FIFO memory 1013 includes an input terminal 1001 and a potential comparison unit 1005, which are similar to those shown in FIG. 16 respectively.

The input terminal 1001 of one FIFO memory 1013 is connected with an external input terminal 1015, so that the external voltage signal OS is received through the external input terminal 1015 and the input terminal 1001.

The other FIFO memory 013 receives the external voltage signal OS from the LSI 1011 through the input terminal 1001. The external voltage signal OS which is inputted in the two FIFO memories 1013 is an analog voltage signal, for example.

Figure 18:
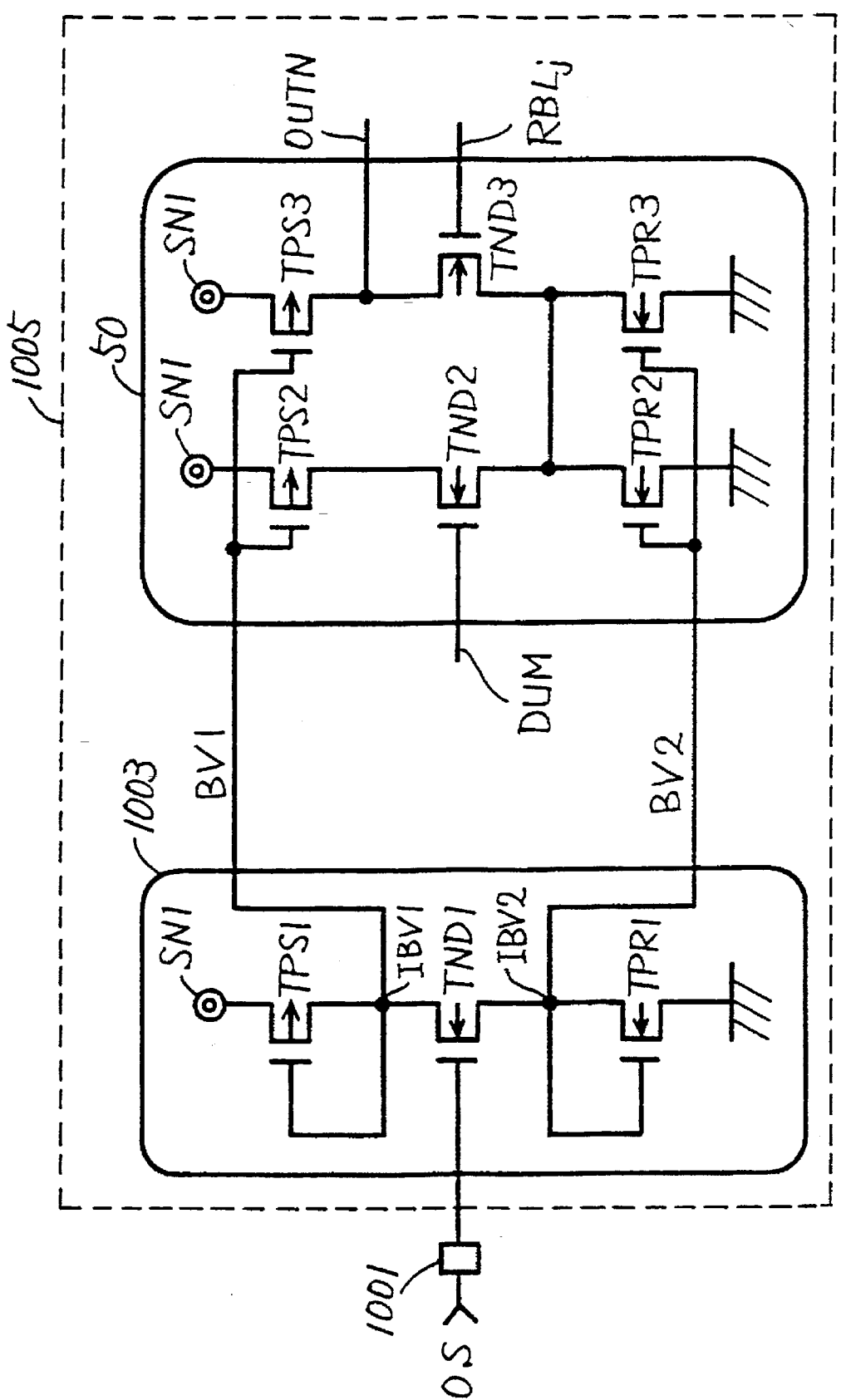
FIG. 18 is a circuit diagram showing a potential comparison unit shown in FIG. 16 in detail.

FIG. 18 is a circuit diagram showing the voltage comparison unit 1005 shown in FIG. 16 in detail.

Referring to FIG. 18, the potential comparison unit 1005 is formed by the bias voltage generation circuit 1003 and the differential amplifier 50. The bias voltage generation circuit 1003 is formed by a loading PMOS transistor TPS1, an external voltage signal application NMOS transistor TND1, and a current source NMOS transistor TPR1.

The differential amplifier 50 is formed by loading PMOS transistors TPS2 and TPS3, driver NMOS transistors TND2 and TND3, and current source NMOS transistors TPR2 and TPR3.

In the differential amplifier 50, the loading PMOS transistor TPS2, the driver NMOS transistor TND2 and the current source NMOS transistor TPR2 are connected in series between a source node SN1 and a ground node. A gate of the driver NMOS transistor TND2 is connected to a dummy read bit line DUM.

The loading PMOS transistor TPS3, the driver NMOS transistor TND3 and the current source NMOS transistor TPR3 are connected in series between a source node SN1 and a ground node. A gate of the driver NMOS transistor TND3 is connected to a read bit line RBLj.

Gates of the loading PMOS transistors TPS1, TPS2 and TPS3 are connected in common. Gates of the current source NMOS transistors TPR1, TPR2 and TPR3 are connected in common. Drains of the loading PMOS transistor TPS3 and the driver NMOS transistor TND3 are connected to an output node OUTN. Sources of the driver NMOS transistor TND2 and the loading NMOS transistor TND3 are connected with each other.

The loading PMOS transistors TPS2 and TPS3, the driver NMOS transistors TND2 and TND3, and the current source NMOS transistors TPR2 and TPR3 are identical in size to each other respectively.

In the bias voltage generation circuit 1003, on the other hand, the loading PMOS transistor TPS1, the external voltage signal application NMOS transistor TND1 and the current source NMOS transistor TPR1 are connected in series between a source node SN1 and a ground node. A gate of the external voltage signal application NMOS transistor TND1 is connected to the input terminal 1001.

A gate of the loading PMOS transistor TPS1 is connected to its drain, to form a bias voltage supply terminal IBV1. A gate of the current source NMOS transistor TPR1 is connected to its drain, to form a bias voltage supply terminal IBV2. The size ratio of the loading PMOS transistor TPS1 and the current source NMOS transistor TPR1 is proportional to that of the loading PMOS transistor TPS2 and the current source NMOS transistor TPR2 and that of the loading PMOS transistor TPS3 and the current source NMOS transistor TPR3.

The operation is now described. The differential amplifier 50 attains the highest performance when all transistors TPS2, TPS3, TND2, TND3, TPR2 and TPR3 forming the same are in saturated states. It is possible to saturate all transistors TPS2, TPS3, TND2, TND3, TPR2 and TPR3 forming the differential amplifier 50 by forming the bias voltage generation circuit 1003 as described above with respect to the differential amplifier 50.

The loading PMOS transistor TPS1 and the current source NMOS transistor TPR1, which are diode-connected transistors, operate in saturated states unless the same are turned off.

As hereinabove described, the size ratio of the loading PMOS transistor TPS1 and the current source NMOS transistor TPR1 is proportional to that of the loading PMOS transistor TPS2 and the current source NMOS transistor TPR2 and that of the loading PMOS transistor TPS3 and the current source NMOS transistor TPR3.

Further, a gate voltage and a source voltage of the loading PMOS transistor TPS1 are equal to those of the loading PMOS transistors TPS2 and TPS3 respectively.

In addition, a gate voltage and a source voltage of the current source NMOS transistor TPR1 are equal to those of the current source NMOS transistors TPR2 and TPR3 respectively.

When the loading POS transistor TPS1 and the current source NMOS transistor TPR1 operate in saturated states, therefore, the loading PMOS transistor TPS2 and the current source NMOS transistor TPR2 as well as the loading PMOS transistor TPS3 and the current source NMOS transistor TPR3 generally operate in saturated states.

The driver NMOS transistors TND2 and TND3 operate in saturated or unsaturated states depending on the values or amplitudes of input voltages from the dummy read bit line DUM and the read bit line RBLj respectively. At least at the time of starting of differential amplification, however, input voltages are supplied to gates of the driver NMOS transistors TND2 and TND3 so that these transistors operate in saturated states.

Saturation/unsaturation of the external voltage signal application NMOS transistor TND1 is also varied with the external voltage signal OS which is applied to the input terminal 1001, while its operating state counts for nothing.

Consider that the external voltage signal OS which is applied to the input terminal 1001 is changed. The external voltage signal application NMOS transistor TND1 can be regarded as resistance means whose resistance value is varied with the external voltage signal OS. Therefore, the resistance value is reduced as the external voltage signal OS which is applied to the gate of the external voltage signal application NMOS transistor TND1 is increased, and vice versa.

Thus, the bias voltage BV2 from the bias voltage supply terminal IBV2 is reduced and the bias voltage BV1 from the bias voltage input terminal IBV1 is increased as the resistance value of the external voltage signal application NMOS transistor TND1 is increased. On the other hand, the bias voltage BV2 is increased and the bias voltage BV1 is reduced as the resistance Value of the external voltage signal application NMOS transistor TND1 is reduced.

Namely, the bias voltage BV2 is increased as the external voltage signal OS is increased, whereby the current source NMOS transistors TPR2 and TPR3 of the differential amplifier 50 receiving the bias voltage BV2 in the gates thereof are strongly turned on. Therefore, drain-to-source currents (hereinafter referred to as "consumed currents") of the current source NMOS transistors TPR2 and TPR3 are increased, and the differential amplifier 50 operates at a high speed.

On the other hand, the bias voltage BV2 is reduced as the external voltage signal OS is reduced, whereby the current source NMOS transistors TPR2 and TPR3 of the differential amplifier 50 receiving the bias voltage BV2 in the gates thereof are weakly turned on. Therefore, the consumed currents are reduced, and the differential amplifier 50 operates at a low speed.

In general, a bias voltage can be directly applied to the gates of the current source NMOS transistors TPR2 and TPR3 of the differential amplifier 50 from the exterior, in order to simply control the current consumption in the differential amplifier 50. In this case, however, the loading PMOS transistor TPS2 and the current source NMOS transistor TPR2 as well as the loading PMOS transistor TPS3 and the current source NMOS transistor TPR3 are so unbalanced that the loading PMOS transistors TPS2 and TPS3 or the current source NMOS transistors TPR2 and TPR3 are unsaturated to remarkably deteriorate the performance of the differential amplifier 50.

However, the differential amplifier 50 shown in FIG. 18 has no such problem since saturated states of the loading PMOS transistors TPS2 and TPS3 and the current source NMOS transistors TPR2 and TPR3 are guaranteed by the diode-connected loading PMOS and current source NMOS transistors TPS1 and TPR1 respectively.

The external voltage signal application NMOS transistor TND1 of the bias voltage generation circuit 1003 shown in FIG. 18 can be replaced by a PMOS transistor. In this case, the bias voltage BV2 is reduced and the current consumption of the differential amplifier 50 is reduced as the external voltage signal OS is increased, and the differential amplifier 50 operates at a low speed. On the other hand, the bias voltage BV2 is increased and the current consumption of the differential amplifier 50 is increased as the external voltage signal is increased, and the differential amplifier 50 operates at a high speed.

Thus, the external voltage signal application NMOS transistor TND1 is provided between the diode-connected transistors TPS1 and TPR1 so that the external voltage signal OS is applied to this transistor TND1, whereby the current consumption is controlled while guaranteeing saturation of the transistors TPS1, TPS2, TPS3, TPR1, TPR2 and TPR3.

In the FIFO memory according to the twelfth embodiment, as hereinabove described, the current consumption of the differential amplifier 50 can be controlled by controlling the bias voltage generation circuit 1003 for generating the bias voltages BV1 and BV2 to the differential amplifier 50 by the external voltage signal OS which is inputted from the exterior. Thus, the speed of the differential amplifier 50 can be optimized in response to the specification of the FIFO memory, thereby optimizing power consumption.

Figure 19:
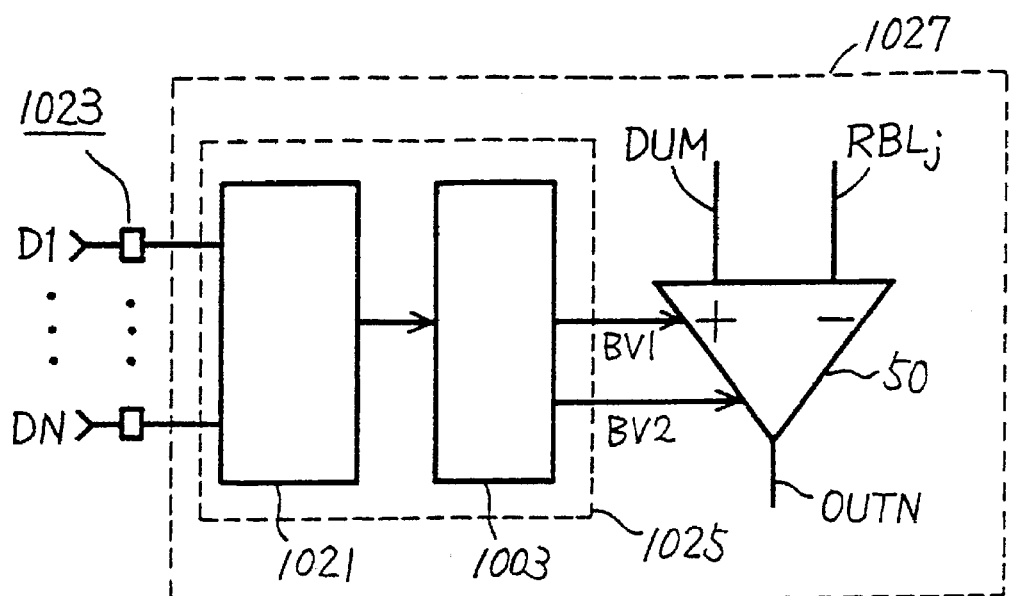
FIG. 19 is a circuit diagram showing a portion for comparing potentials of a read bit line and a dummy read bit line provided in a FIFO memory according to a modification of the twelfth embodiment.

FIG. 19 is a circuit diagram showing a portion for comparing potentials of a read bit line and a dummy read bit line with each other in a FIFO memory according to a modification of the twelfth embodiment.

Referring to FIG. 19, the portion for comparing the potentials of the read bit line and the dummy read bit line with each other in the FIFO memory according to the modification of the twelfth embodiment includes a plurality of input terminals 1023 and a potential comparison unit 1027. The potential comparison unit 1027 comprises a bias voltage generation unit 1025 and a differential amplifier 50. The bias voltage generation unit 1025 comprises a regulator 1021 and a bias voltage generation circuit 1003.

The differential amplifier 50 shown in FIG. 19 can be employed as that of the FIFO memory according to each of the first to ninth embodiments, for example. The plurality of input terminals 1023 and the bias voltage generation unit 1025 are provided with respect to the differential amplifier 50. For example, the bias voltage generation unit 1025 may be provided for the FIFO memory, or every differential amplifier 50, in an arbitrary number in response to the design. Referring to FIG. 19, parts which are common with those shown in FIG. 16 are denoted by the same reference numerals, to omit redundant description.

The potential comparison unit 1027 shown in FIG. 19 is prepared by providing the potential comparison unit 1005 shown in FIG. 16 with the regulator 1021. The regulator 1021 has at least one connection terminal (not shown) with respect to the bias voltage generation circuit 1003.

The regulator 1021 has a plurality of terminals (not shown) which are connected with respective ones of the plurality of input terminals 1023. Digital codes D1 to DN are inputted in the regulator 1021 from the exterior through the plurality of input terminals 1023. The regulator 1021 controls the bias voltage generation circuit 1003 through the plurality of terminals (not shown) in response to the inputted digital codes D1 to DN, thereby controlling bias voltages BV1 and BV2.

Figure 20:
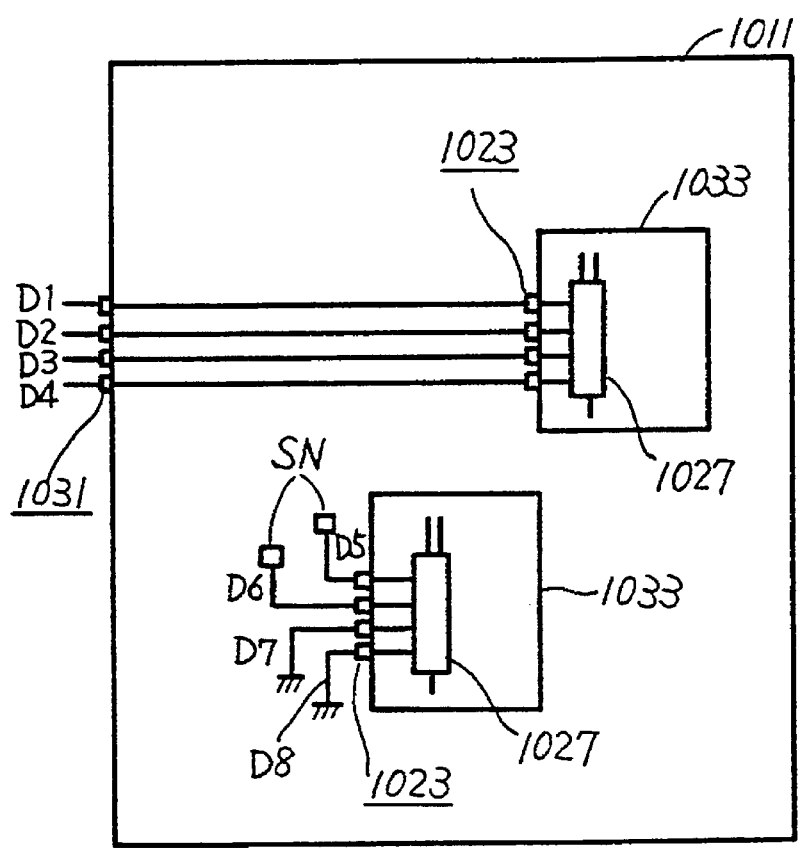
FIG. 20 is a schematic block diagram showing the FIFO memory according to the modification of the twelfth embodiment provided in an LSI.

FIG. 20 is a schematic block diagram showing FIFO memories according to the modification of the twelfth embodiment, which are provided in an LSI 1011.

Referring to FIG. 20, the LSI 1011 is provided therein with two FIFO memories 1033 according to the modification of the twelfth embodiment. Each of the FIFO memories 1033 includes a potential comparison unit 1027 and a plurality of input terminals 1023. The potential comparison unit 1027 and the input terminals 1023 are similar to those shown in FIG. 19 respectively. The FIFO memory 1033 is provided with four input terminals 1023. The LSI 1011 comprises four external input terminals 1031.

The respective input terminals 1023 of one FIFO memory 1033 shown in FIG. 20 are connected to the respective ones of the external input terminals 1031. Namely, digital codes D1 to D4 are inputted in the potential comparison unit 1027 of this FIFO memory 1033 through the external input terminals 1031 and the input terminals 1023.

Two of the four input terminals 1023 of the other FIFO memory 1033 are connected to source nodes SN, while the remaining two are connected to ground nodes. Namely, digital codes D5 to D8 are formed by power sources and the ground on the LSI 1011.

As hereinabove described, the digital codes may be inputted from the external input terminals 1031. Further, the digital codes may be formed by connecting the respective ones of the input terminals 1023 to the source nodes SN and the ground nodes in an on-chip time in response to the specification of the FIFO memory.

Figure 21:
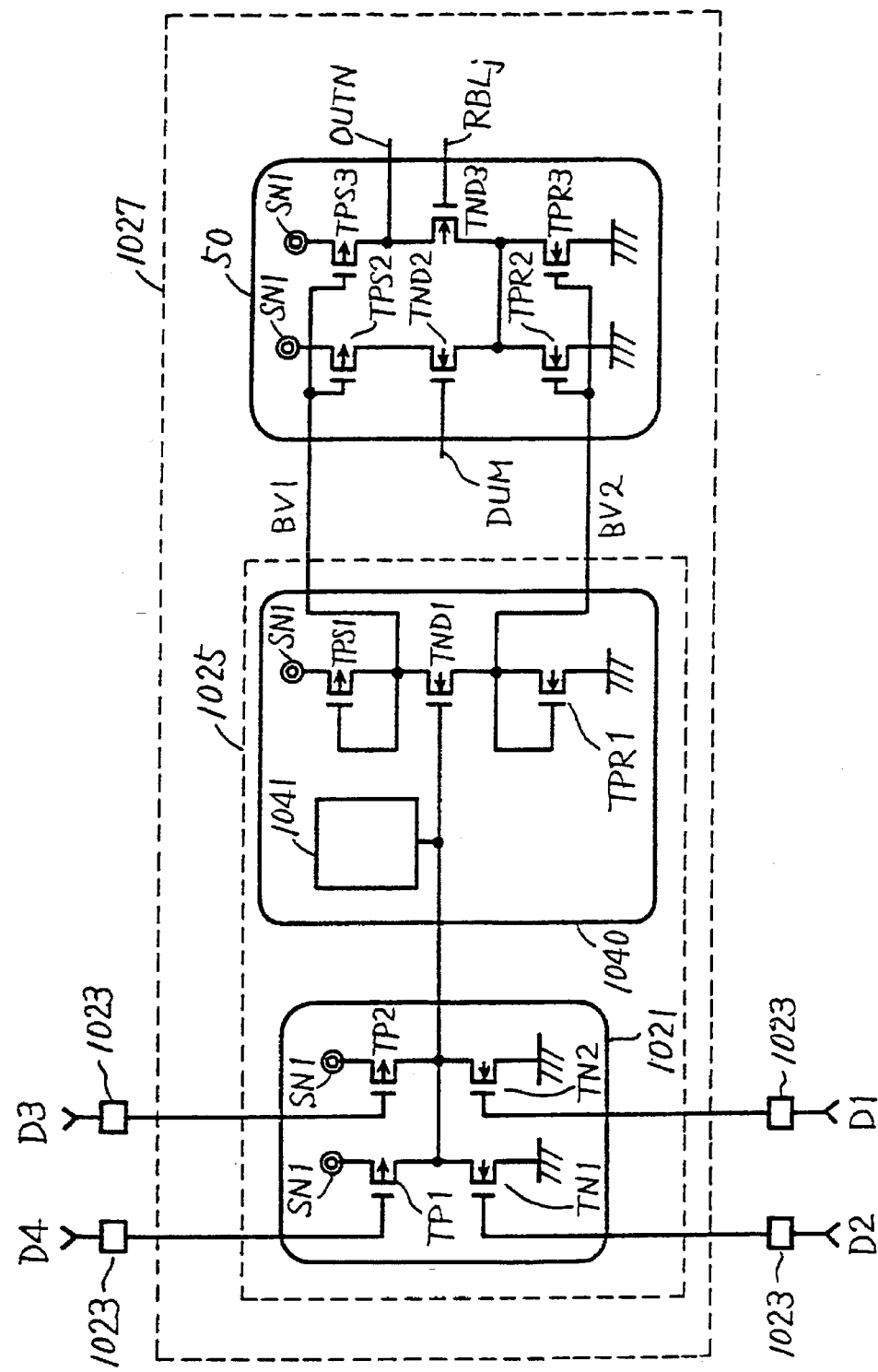
FIG. 21 is a circuit diagram showing a potential comparison unit shown in FIG. 19 in detail.

FIG. 21 is a circuit diagram showing the potential comparison unit 1027 of FIG. 19 in detail.

Referring to FIG. 21, parts which are common with those in FIGS. 18 and 19 are denoted by the same reference numerals, to properly omit redundant description. Referring to FIG. 21, the regulator 1021 comprises PMOS transistors TP1 and TP2 and NMOS transistors TN1 and TN2. A bias voltage generation circuit 1040 is prepared by providing the bias voltage generation circuit 1003 shown in FIG. 18 further with an analog voltage generation circuit 1041.

In the regulator 1021, the PMOS transistor TP1 and the NMOS transistor TN1 are connected in series between a source node SN1 and a ground node. The PMOS transistor TP2 and the NMOS transistor TN2 are connected in series between a source node SN1 and a ground node.

Gates of the PMOS transistors TP1 and TP2 and the NMOS transistors TN1 and TN2 are connected to the respective ones of the four input terminals 1023. Signals D4, D3, D2 and D1 are inputted in the gates of the PMOS transistors TP1 and TP2 and the NMOS transistors TN1 and TN2 respectively.

The analog voltage generation circuit 1041 and the drains of the PMOS transistors TP1 and TP2 and the NMOS transistors TN1 and TN2 are connected to a gate of an external voltage signal application NMOS transistor TND1 of the bias voltage generation circuit 1040.

The operation is now described. The analog voltage generation circuit 1041 generates a constant voltage for generating bias voltages BV1 and BV2 so that the differential amplifier 50 is at an intermediate speed. ON/OFF states of all transistors TP1, TP2, TN1 and TN2 of the regulator 1021 are varied with the digital codes D1 to D4.

Assuming that D4=D3="high" and D2=D1="low" are inputted, for example, all transistors TP1, TP2, TN1 and TN2 of the regulator 102 are turned off so that only the constant voltage from the analog voltage generation circuit 1021 is applied to the gate of-the external voltage signal application NMOS transistor TND1 of the bias voltage generation circuit 1040. Namely, bias voltages BV1 and BV2 bringing the differential amplifier 50 into an intermediate speed are applied thereto. Thus, the current consumption of the differential amplifier 50 is also intermediate.

On the other hand, when D3="high" and D4=D2=D1 ="low" are inputted, for example, only the PMOS transistor TP1 is turned on. Thus, the constant voltage from the analog voltage generation circuit 1041 and a source voltage from the source node SN1 are applied to the gate of the external voltage signal application NMOS transistor TND1 of the bias voltage generation circuit 1040. Therefore, the external voltage signal application NMOS transistor TND1 is strongly turned on, whereby the bias voltage BV2 is increased and current source NMOS transistors TPR2 and TPR3 are also strongly turned on. Thus, the current consumption of the differential amplifier 50 is increased, whereby the differential amplifier 50 operates at a high speed.

In the FIFO memory according to the modification of the twelfth embodiment, as hereinabove described, the current consumption of the differential amplifier 50 can be controlled by controlling the bias voltage generation unit 1025 generating the bias voltages BV1 and BV2 to the differential amplifier 50 by the external digital codes D1 to D4. Thus, the speed of the differential amplifier 50 can be optimized in response to the specification of the FIFO memory, whereby power consumption can be optimized.

The potential comparison unit 1005 and the input terminal 1001 shown in FIG. 16, or the potential comparison unit 1027 and the input terminal 1023 shown in FIG. 19 can also be applied to each of the DRAMs according to the tenth and eleventh embodiments, to attain an effect which is similar to that in the case of application to a FIFO memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic memory comprising:
  a plurality of memory cells arranged at least in one column for storing information written therein;
  at least one dummy memory cell for storing dummy information written therein;
  at least one write bit line for supplying information of a first or second level to be selectively written in said plurality of memory cells;
  at least one dummy information supply means for fixedly supplying dummy information of a third level between said first and second levels to be written in said dummy memory cell;
  at least one read bit line for receiving a potential responsive to information selectively read from said plurality of memory cells; and
  a dummy read bit line for receiving a potential responsive to information read from said dummy memory cell,
  each of said plurality of memory cells and said dummy memory cell including:
    a capacitor for storing information,
    a first transistor for transmitting information supplied from corresponding said write bit line or said dummy information supply means to said capacitor in writing, a second transistor for supplying a potential responsive to the level of said information stored in said capacitor, and a third transistor for transmitting said potential supplied from said second transistor to corresponding said read bit line or said dummy read bit line in reading, said dynamic memory further comprising:

at least one comparison means for comparing potentials of said read bit line and said dummy read bit line with each other and outputting information indicating the level of said information selectively read from said plurality of memory cells on the basis-of the result of said comparison.

2. The dynamic memory in accordance with claim 1, further comprising:

at least one first potential fixing means for fixing the potential of said dummy read bit line at a first prescribed potential, when the potential of said dummy read bit line is lower than said first prescribed potential which is higher than the minimum potential of said read bit line, at least one control signal generation means receiving an output signal of said comparison means and a prescribed clock signal defining timing for fixing the potential of said read bit line and generating said output signal of said comparison means as a control signal for fixing the potential of said read bit line in response to said clock signal, and at least one second potential fixing means for fixing the potential of said read bit line at a second prescribed potential being higher than said first prescribed potential in response to said control signal from said control signal generation means when said control signal indicates that the potential of said read bit line is higher than that of said dummy read bit line.

3. The dynamic memory in accordance with claim 1, further comprising:

at least one first potential fixing means for fixing the potential of said dummy read bit line at a first prescribed potential, when the potential of said dummy read bit line is lower than said first prescribed potential which is higher than the minimum potential of said read bit line, and at least one control signal generation means for comparing the potentials of said read bit line and said dummy read bit line with each other and generating a control signal for fixing the potential of said read bit line in response to the result of said comparison, said control signal generation means including:

diode means connected to said read bit line for supplying a potential being lower than that of said read bit line by a first prescribed level, and comparison/output means for comparing a first potential being the potential of said read bit line through said diode means with a second potential being that of said dummy read bit line for outputting, as said control signal, a signal taking a second prescribed level when said first potential is higher than said second potential, said dynamic memory further comprising:

at least one second potential fixing means for fixing the potential of said read bit line at a second prescribed potential being higher than said first prescribed potential when said control signal of said control signal generation means is at said second prescribed level.

4. The dynamic memory in accordance with claim 1, wherein said information written in said plurality of memory cells is read in the order of writing.

5. The dynamic memory in accordance with claim 1, wherein said information written in said plurality of memory cells is read at random.

6. A dynamic memory comprising:

a plurality of memory cells arranged at least in one column for storing information written therein;

at least one dummy memory cell for storing dummy information written therein;

at least one write bit line for supplying information of a first or second level to be selectively written in said plurality of memory cells;

at least one dummy information supply means for fixedly supplying dummy information to be written in said dummy memory cell;

at least one read bit line for receiving a potential responsive to information selectively read from said plurality of memory cells;

a dummy read bit line for receiving a potential responsive to information read from said dummy memory cell; and capacitive means connected to said dummy read bit line for bringing the potential of said dummy read bit line to a level between potentials of two levels being responsive to said information of said first or second level transmitted to said read bit line in reading, each of said plurality of memory cells and said dummy memory cell including:

a capacitor for storing information, a first transistor for transmitting information supplied from corresponding said write bit line or said dummy information supply means to said capacitor in writing, a second transistor for supplying a potential responsive to the level of said information stored in said capacitor, and a third transistor for transmitting said potential supplied from said second transistor to corresponding said read bit line or said dummy read bit line in reading, said dynamic memory further comprising:

at least one comparison means for comparing the potentials of said read bit line and said dummy read bit line with each other and outputting information indicating the level of said information selectively read from said plurality of memory cells on the basis of the result of said comparison.

7. The dynamic memory in accordance with claim 6, further comprising:

at least one first potential fixing means for fixing the potential of said dummy read bit line at a first prescribed potential, when the potential of said dummy read bit line is lower than said first prescribed potential which is higher than the minimum potential of said read bit line, at least one control signal generation means receiving an output signal of said comparison means and a prescribed clock signal defining timing for fixing the potential of said read bit line and generating said output signal of said comparison means as a control signal for fixing the potential of said read bit line in response to said clock signal, and at least one second potential fixing means for fixing the potential of said read bit line at a second prescribed potential being higher than said first-prescribed potential in response to said control signal from said control signal generation means when said control signal indicates that the potential of said read bit line is higher than that of said dummy read bit line.

8. The dynamic memory in accordance with claim 6, further comprising:

at least one first potential fixing means for fixing the potential of said dummy read bit line at a first prescribed potential, when the potential of said dummy read bit line is lower than said first prescribed potential which is higher than the minimum potential of said read bit line, at least one control signal generation means for comparing the potentials of said read bit line and said dummy read bit line with each other and generating a control signal for fixing the potential of said read bit line in response to the result of said comparison, said control signal generation means including:

diode means connected to said read bit line for supplying a potential being lower than that of said read bit line by a first prescribed level, and comparison/output means for comparing a first potential being the potential of said read bit line through said diode means with a second potential being that of said dummy read bit line for outputting, as said control signal, a signal taking a second prescribed level when said first potential is higher than said second potential, said dynamic memory further comprising:

at least one second potential fixing means for fixing the potential of said read bit line at a second prescribed potential being higher than said first prescribed potential when said control signal of said control signal generation means is at said second prescribed level.

9. The dynamic memory in accordance with claim 6, wherein said capacitive means is provided in the same number as said dummy memory cell in one-to-one correspondence to said dummy memory cell.

10. A dynamic memory comprising:

a plurality of memory cells arranged in a plurality of columns for storing information written therein;

a plurality of dummy memory cells provided in a plurality of columns for storing dummy information written therein, at least one said column corresponding to every prescribed number of columns of said plurality of columns of said plurality of memory cells;

a plurality of write bit lines provided in correspondence to respective ones of said columns of said plurality of memory cells, each said write bit line supplying information of a first or second level to be written in said memory cells of corresponding said column;

dummy information supply means for fixedly supplying dummy information to be written in respective ones of said plurality of dummy memory cells;

a plurality of read bit lines provided in correspondence to respective ones of said plurality of columns of said plurality of memory cells for receiving potentials responsive to information read from said memory cells of corresponding said columns respectively; and a plurality of dummy read bit lines provided in correspondence to respective ones of said columns of said plurality of dummy memory cells for receiving potentials responsive to information read from said dummy memory cells of corresponding said columns respectively, each of said plurality of memory cells and said plurality of dummy memory cells including:

a capacitor for storing information, a first transistor for transmitting information supplied from corresponding said write bit line or said dummy information supply means to said capacitor in writing, a second transistor for supplying a potential responsive to the level of said information being stored in said capacitor, and a third transistor for transmitting said potential supplied from said second transistor to corresponding said read bit line or said dummy read bit line in reading, said dynamic memory further comprising:

a plurality of comparison means provided in correspondence to respective ones of said columns of said plurality of memory cells, each having a first input node receiving the potential of corresponding said read bit line and a second input node receiving the potential of said dummy read bit line corresponding to said read bit line for comparing the potentials received by said input nodes and outputting a signal indicating the level of information read from said memory cells of corresponding said column on the basis of the result of said comparison, the total sum of input capacitance values of said second input nodes of said plurality of comparison means related to one said dummy read bit line being rendered larger than an input capacitance value of said first input node of one said comparison means related to one said read bit line, for bringing the potential of one said dummy read bit line to an intermediate level of potentials of two levels transmitted to one said read bit line in response to said information of said first or second level in reading.

11. The dynamic memory in accordance with claim 10, further comprising:

a plurality of first potential fixing means provided in correspondence to respective ones of said plurality of dummy read bit lines, each fixing the potential of corresponding said dummy read bit line at a first prescribed potential, when the potential of corresponding said dummy read bit line is lower than said first prescribed potential which is higher than the potential of one said read bit line, a plurality of control signal generation means provided in correspondence to respective ones of said plurality of comparison means, each receiving an output signal of corresponding said comparison means and a prescribed clock signal defining timing for fixing the potential of corresponding said read bit line and generating said output signal of said corresponding comparison means as a control signal for fixing the potential of said corresponding read bit line in response to said clock signal, and a plurality of second potential fixing means provided in correspondence to respective ones of said plurality of control signal generation means, each fixing the potential of corresponding said read bit line at a second prescribed potential being higher than said first prescribed potential in response to said control signal from said control signal generation means when said control signal of corresponding said control signal generation means indicates that the potential of said corresponding read bit line is higher than that of corresponding said dummy read bit line.

12. The dynamic memory in accordance with claim 10, further comprising:

a plurality of first potential fixing means provided in correspondence to respective ones of said plurality of dummy read bit lines, each fixing the potential of corresponding said dummy read bit line at a first prescribed potential, when the potential of corresponding said dummy read bit line is lower than said first prescribed potential which is higher than the minimum potential of corresponding said read bit line, and a plurality of control signal generation means provided in correspondence to respective ones of a plurality of sets of said read bit lines and said dummy read bit lines being subjected to comparison of potentials for comparing the potentials of corresponding said read bit lines and corresponding said dummy-read bit lines with each other and generating control signals for fixing the potentials of said corresponding read bit lines in response to the results of said comparison, each of said plurality of control signal generation means including:

diode means connected to corresponding said read bit line for supplying a potential being lower than that of said read bit line by a first prescribed level, and comparison/output means for comparing a first potential being the potential of said read bit line through said diode means with a second potential being that of said dummy read bit line and outputting, as said control signal, a signal taking a second prescribed level when said first potential is higher than said second potential, said dynamic memory further comprising:

a plurality of second potential fixing means provided in correspondence to respective ones of said plurality of read bit lines, each fixing the potential of corresponding said read bit line at a second prescribed potential being higher than said first prescribed potential when said control signal of corresponding said control signal generation means is at said second prescribed level.

13. A dynamic memory comprising:

a plurality of memory cells arranged at least in one column for storing information written therein;

at least one dummy memory cell for storing dummy information written therein;

at least one write bit line for supplying information of a first or second level to be selectively written in said plurality of memory cells;

at least one dummy information supply means for fixedly supplying dummy information to be written in said dummy memory cell;

at least one read bit line for receiving a potential responsive to information selectively read from said plurality of memory cells; and a dummy read bit line for receiving a potential responsive to information read from said dummy memory cell, each of said plurality of memory cells and said plurality of dummy memory cells including:

a capacitor for storing information, a first transistor for transmitting information supplied from corresponding said write bit line or said dummy information supply means to said capacitor in writing, a second transistor for supplying a potential responsive to the level of said information stored in said capacitor, and a third transistor for transmitting said potential supplied from said second transistor to corresponding said read bit line or said dummy read bit line in reading, said dynamic memory further comprising:

a source node receiving a source potential;

first load resistance means connected between said source node and said read bit line, and having a first resistance value;

second load resistance means connected between said source node and said dummy read bit line, and having a second resistance value being smaller than said first resistance value; and at least one comparison means for comparing potentials of said read bit line and said dummy read bit line with each other and outputting a signal indicating the level of information selectively read from said plurality of memory cells on the basis of the result of said comparison.

14. The dynamic memory in accordance with claim 13, further comprising:

pull-up means connected between said source node and said read bit line in parallel with said first load resistance means for pulling up the potential of said read bit line at prescribed timing.

15. A dynamic memory comprising:

a plurality of memory cells arranged at least in one column for storing information written therein;

at least one write bit line for supplying information of a first or second level to be written in said plurality of memory cells;

at least one read bit line for receiving a potential responsive to information being read from said plurality of memory cells; and at least one dummy read bit line having a potential being set at an intermediate level between potentials of two levels responsive to said information of said first or second level transmitted to said read bit line, each of said plurality of memory cells including:

a capacitor for storing information, a first transistor for transmitting information supplied from corresponding said write bit line to said capacitor in writing, a second transistor for supplying a potential responsive to the level of said information stored in said capacitor, and a third transistor for transmitting said potential supplied from said second transistor to corresponding said read bit line in reading, said dynamic memory further comprising:

at least one comparison means for comparing potentials of said read bit line and said dummy read bit line with each other and outputting a signal indicating the level of information read from said plurality of memory cells on the basis of the result of said comparison.

16. The dynamic memory in accordance with claim 15, further comprising:

input means for receiving a voltage signal from the exterior, and first voltage generation means for generating a first voltage for controlling said comparison means in response to said voltage signal from the exterior, said comparison means deciding current consumption in said comparison means in response to the magnitude of said first voltage from said first voltage generation means.

17. The dynamic memory in accordance with claim 16, wherein said input means is one input terminal, said voltage signal from the exterior being an analog signal.

18. The dynamic memory in accordance with claim 17, wherein said first voltage generation means includes a transistor deciding the magnitude of said first voltage being applied to said comparison means in response to said analog signal, said transistor deciding the magnitude of said first voltage receiving said analog signal at its control electrode.

19. The dynamic memory in accordance with claim 16, wherein said input means includes a plurality of input terminals, said voltage signal from the exterior being a digital code.

20. The dynamic memory in accordance with claim 19, wherein said first voltage generation means includes second voltage generation means for generating a second voltage responsive to said digital code, said second voltage generation means controlling the magnitude of said first voltage depending on that of said second voltage responsive to said digital code.

21. The dynamic memory in accordance with claim 20, wherein said first voltage generation means further includes:

third voltage generation means for generating a third voltage being constant, and a transistor receiving said second and third voltages at its control electrode for deciding the magnitude of said first voltage being applied to said comparison means in response to the magnitudes of said second and third voltages, said plurality of input terminals being provided in two, said digital code being of two bits, said second voltage generation means including:

fourth voltage generation means for generating a fourth voltage in response to information of one said bit of said digital code, and fifth voltage generation means for generating a fifth voltage in response to information of the other said bit of said digital code, said fourth and fifth voltage generation means having an output node in common, a potential of said common output node being employed as said second voltage.

22. The dynamic memory in accordance with claim 15, wherein said information written in said plurality of memory cells is read in the order of writing.

23. The dynamic memory in accordance with claim 15, wherein said information written in said plurality of memory cells is read at random.

24. A dynamic memory comprising:

reference potential generation means for generating a plurality of first reference potentials of at least four types of levels, and a plurality of second reference potentials being at intermediate levels of approximate said levels in said first reference potentials;

potential deriving means for selectively deriving said plurality of first reference potentials generated from said reference potential generation means;

a plurality of memory cells arranged in at least one column for storing information of said first referential potentials derived by said potential deriving means written therein;

a plurality of dummy memory cells provided at least in the same number as said second reference potentials for storing information of respective ones of said plurality of second reference potentials written therein;

at least one read bit line for receiving a potential responsive to information selectively read from said plurality of memory cells; and a plurality of dummy read bit lines provided in correspondence to respective ones of said plurality of dummy memory cells, each receiving a potential responsive to information read from corresponding said dummy memory cell, each of said plurality of memory cells and said plurality of dummy memory cells including:

a capacitor for storing information, a first transistor for transmitting information supplied from said potential deriving means or said reference potential generation means to said capacitor in writing, a second transistor for supplying a potential responsive to the level of said information stored in said capacitor, and a third transistor for transmitting said potential supplied from said second transistor to said read bit line or said dummy read bit line in reading, said dynamic memory further comprising:

comparison means for comparing potentials of said read bit line and said plurality of dummy read bit lines with each other, and conversion means for converting the result of said comparison in said comparison means to a signal indicating the level of information read from said plurality of memory cells and outputting said signal.

25. The dynamic memory in accordance with claim 24, wherein said information written in said plurality of memory cells is read in the order of writing.

26. The dynamic memory in accordance with claim 24, wherein said information written in said plurality of memory cells is read at random.

* * * * *